(12) United States Patent
Long et al.

(10) Patent No.: US 7,993,459 B2
(45) Date of Patent: Aug. 9, 2011

(54) DELIVERING PARTICULATE MATERIAL TO A VAPORIZATION ZONE

(75) Inventors: Michael Long, Hilton, NY (US); Ronald M. Wexler, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 1480 days.

(21) Appl. No.: 11/264,349

(22) Filed: Oct. 24, 2005

(65) Prior Publication Data
US 2007/0092645 A1 Apr. 26, 2007

(51) Int. Cl.
*C23C 16/00* (2006.01)
(52) U.S. Cl. .......................... 118/726; 118/724
(58) Field of Classification Search .................. 118/726, 118/724
See application file for complete search history.

(56) References Cited

U.S. PATENT DOCUMENTS

| | | | |
|---|---|---|---|
| 2,447,789 A | | 8/1948 | Barr et al. |
| 2,524,560 A | * | 10/1950 | Cote ............................. 141/12 |
| 2,800,252 A | * | 7/1957 | Wahl ............................. 222/55 |
| 3,270,857 A | * | 9/1966 | Wilkes et al. .............. 119/57.7 |
| 3,754,529 A | * | 8/1973 | Fleischner .................. 118/726 |
| 4,885,211 A | | 12/1989 | Tang et al. |
| 4,990,371 A | * | 2/1991 | Dutta et al. .................... 427/213 |
| 5,937,996 A | * | 8/1999 | Friedman et al. ............. 198/533 |
| 6,685,762 B1 | * | 2/2004 | Brewster et al. ................ 75/331 |
| 6,774,318 B2 | * | 8/2004 | Beal et al. ...................... 177/105 |
| 2004/0255857 A1 | | 12/2004 | Chow et al. |

FOREIGN PATENT DOCUMENTS

| | | | |
|---|---|---|---|
| EP | 585848 | * | 8/1993 |
| EP | 0 982 411 | | 3/2000 |
| EP | 1 357 200 | | 10/2003 |
| EP | 1 443 127 | | 8/2004 |
| WO | 2006/034019 | | 3/2006 |

OTHER PUBLICATIONS

English translation of EP 585848, Aug. 1994, Haussler.*

* cited by examiner

*Primary Examiner* — Keath T Chen
(74) *Attorney, Agent, or Firm* — Morgan, Lewis & Bockius LLP

(57) ABSTRACT

It is an object of the present invention to provide an effective way of replenishing particulate material for vaporization. This object is achieved by a method for delivering material into a deposition chamber having a vaporization zone to vaporize such material to form a layer. The improvement includes providing a cartridge defining a cavity for receiving material under a controlled environment for preventing material contamination, receiving material from the cavity and translating such received material along a feed path to the vaporization zone and removably securing the cartridge to the deposition chamber.

18 Claims, 28 Drawing Sheets

DELIVERING PARTICULATE MATERIAL TO A VAPORIZATION ZONE

CROSS REFERENCE TO RELATED APPLICATIONS

Figure 1:
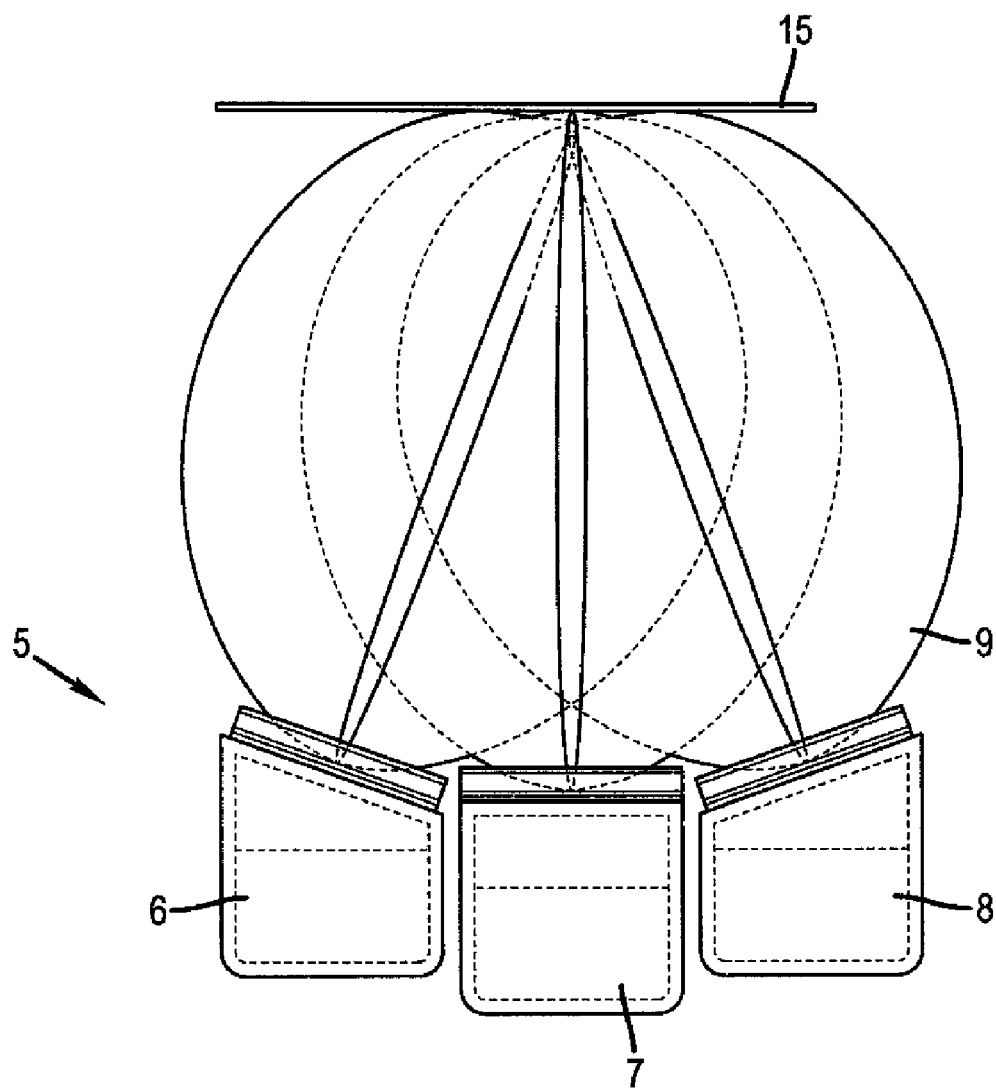

Reference is made to U.S. patent application Ser. No. 11/134,654 filed May 20, 2005 entitled "Delivering Organic Powder to a Vaporization Zone" by Long et al., now U.S. Pat. No. 7,501,152.

Reference is also made to commonly assigned U.S. patent application Ser. No. 10/805,980 filed Mar. 22, 2004 entitled "Vaporizing Fluidized Organic Materials" by Long et al., now U.S. Pat. No. 7,238,389; U.S. patent application Ser. No. 10/784,585 filed Feb. 23, 2004, entitled "Device and Method for Vaporizing Temperature Sensitive Materials" by Long et al., now U.S. Pat. No. 7,232,588 and U.S. patent application Ser. No. 11/134,139 filed May 20, 2005 entitled "Delivering Organic Powder to a Vaporization Zone" by Long et al., now U.S. Pat. No. 7,501,151; the disclosures of which are incorporated herein by reference;

Reference is also made to commonly assigned U.S. patent application Ser. No. 11/153,066 filed Jun. 15, 2005 entitled "Feeding Organic Material To A Heated Surface", by Long et al., now U.S. Pat. No. 7,398,605; U.S. patent application Ser. No. 10/984,095 filed Nov. 9, 2004, entitled "Controlling The Vaporization Of Organic Material" by Boroson et al., now abandoned; and U.S. patent application Ser. No. 11/153,066 filed Jun. 15, 2005, entitled "Feeding Organic Material To A Heated Surface", now a U.S. Pat. No. 7,398,605; the disclosures of which are incorporated by reference.

FIELD OF THE INVENTION

The present invention relates to the field of physical vapor deposition of particulate material.

BACKGROUND OF THE INVENTION

An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate dependant vaporization temperature for extended periods of time. Exposure of sensitive organic materials to higher temperatures can cause changes in the structure of the molecules and associated changes in material properties.

To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. In the prior art, it has been necessary to vent the deposition chamber, disassemble and clean the vapor source, refill the source, reestablish vacuum in the deposition chamber and degas the just-introduced organic material over several hours before resuming operation. The low deposition rate and the frequent and time consuming process associated with recharging a source, has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and, as a result, prior art devices frequently require the use of separate sources to co-deposit host and dopant materials.

A consequence of using single component sources is that many sources are required in order to produce films containing a host and multiple dopants. These sources are arrayed one next to the other with the outer sources angled toward the center to approximate a co-deposition condition. In practice, the number of linear sources used to co-deposit different materials has been limited to three. This restriction has imposed a substantial limitation on the architecture of OLED devices, increases the necessary size and cost of the vacuum deposition chamber and decreases the reliability of the system.

Additionally, the use of separate sources creates a gradient effect in the deposited film where the material in the source closest to the advancing substrate is over represented in the initial film immediately adjacent the substrate while the material in the last source is over represented in the final film surface. This gradient co-deposition is unavoidable in prior art methods where a single material is vaporized from each of multiple sources. The gradient in the deposited film is especially evident when the contribution of either of the end sources is more than a few percent of the central source, such as when a co-host is used. FIG. 1 shows a cross-sectional view of such a prior-art vaporization device 5, which includes three individual sources 6, 7, and 8, commonly termed "heating boats", for vaporizing organic material. Vapor plume 9 is preferably homogeneous in the materials from the different sources, but in fact varies in composition from side to side resulting in a non-homogeneous coating on substrate 15.

A further limitation of prior art sources is that the geometry of the vapor manifold changes as the organic material charge is consumed. This change requires that the heater temperature change to maintain a constant vaporization rate and it is observed that the overall plume shape of the vapor exiting the orifices can change as a function of the organic material thickness and distribution in the source, particularly when the conductance to vapor flow in the source with a full charge of material is low enough to sustain pressure gradients from non-uniform vaporization within the source. In this case, as the material charge is consumed, the conductance increases and the pressure distribution and hence overall plume shape improve.

In response to these difficulties in providing material for vapor deposition, commonly assigned U.S. patent application Ser. No. 11/134,654 entitled "Delivering Organic Powder to a Vaporization Zone" by Long et al. filed May 20, 2005, cited above, discloses methods and apparatus for continuously feeding particulate material into a vaporization chamber. Using this approach, organic powder or other particulate material can be fed into the vaporization chamber from a source outside the chamber. Among advantages offered by this approach is the ability to handle and feed material at temperatures well below vaporization, thereby reducing material waste and facilitating mixture and delivery of multiple materials to be vaporized from a single source. However, in order to supply the needed particulate material(s) and support continuous delivery, a feed mechanism should allow straightforward replenishment with ease of handling and with little or no impact on conditions in the vaporization chamber, such as vacuum, for example. Moreover, it would be advantageous to be able to replenish material without requiring that the particulate material itself be handled, measured, or manually transferred at the vaporization facility from one container to another.

SUMMARY OF THE INVENTION

It is an object of the present invention to provide an effective way of replenishing particulate material for vaporization.

Figure 25:
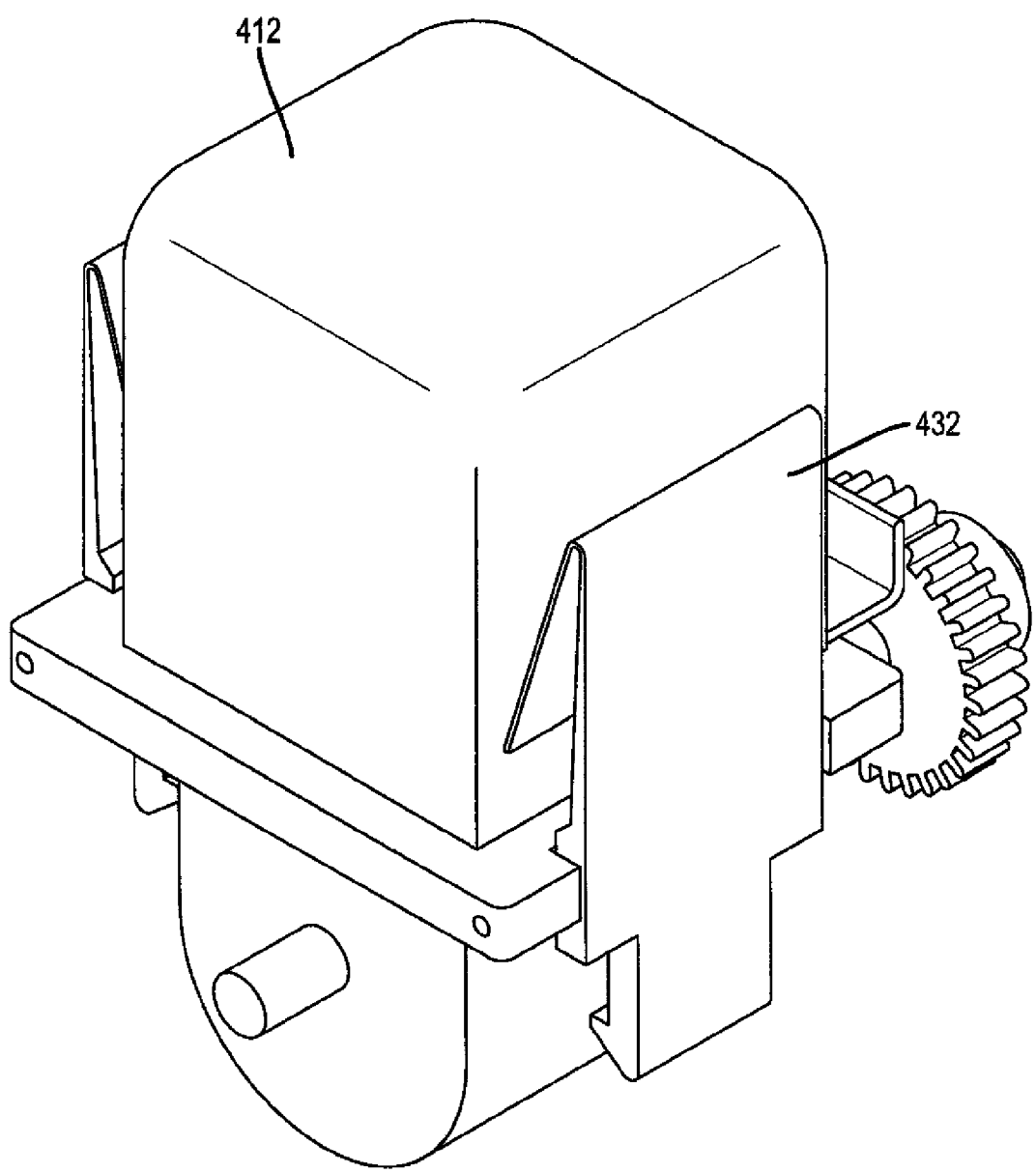
Figure 26:
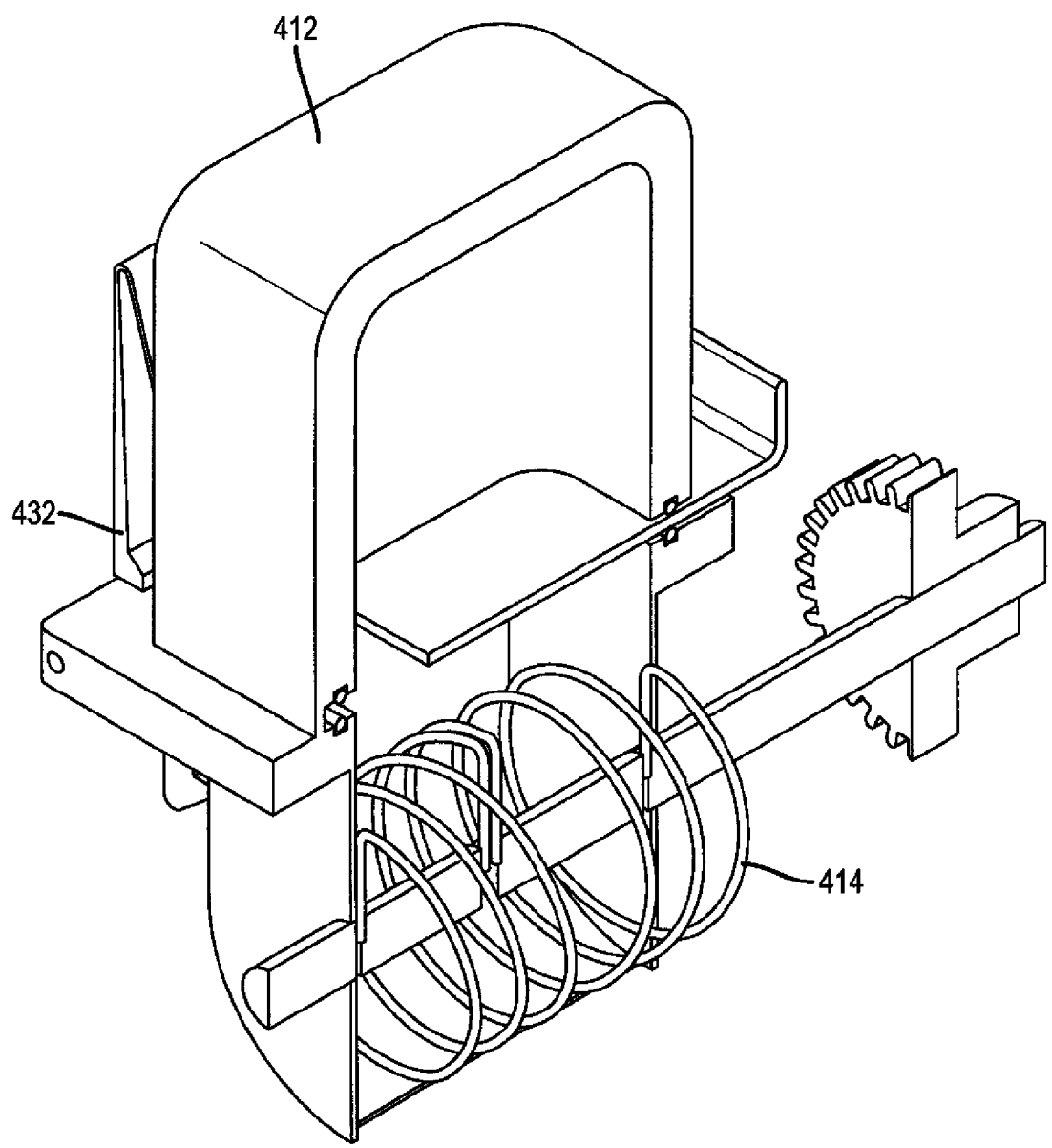

This object is achieved by a method for delivering material into a deposition chamber having a vaporization zone to vaporize such material to form a layer. The improvement includes providing a cartridge defining a cavity for receiving material under a controlled environment for preventing material contamination, receiving material from the cavity and translating such received material along a feed path to the vaporization zone and removably securing the cartridge to the deposition chamber.

It is an advantage of the present invention that the continuous heating of material during operation of prior art devices is eliminated in that only a small portion of particulate material is heated, for a short period of time and at a controlled rate. The bulk of particulate material is maintained at a temperature that can be as much as 300° C. cooler than the desired rate-dependent vaporization temperature. This can be particularly advantageous when vaporizing organic materials.

It is a further advantage of the present invention that it can maintain a steady vaporization rate with a continuously replenished charge of particulate material and with a steady heater temperature. The device thus allows extended operation of the source with substantially reduced risk of degrading even highly temperature-sensitive organic materials.

It is a further advantage of the present invention that it permits materials having different vaporization rates and degradation temperature thresholds to be co-sublimated in the same source.

It is a further advantage of the present invention that it permits linear vaporization rate control by controlling the volumetric metering rate or controlling the feed pressure of the compacted particulate material.

It is a further advantage of the present invention that it can rapidly stop and reinitiate vaporization and achieve a steady vaporization rate quickly by controlling the metering rate of the particulate material, minimizing contamination of the deposition chamber walls and conserving the particulate materials when a substrate is not being coated.

It is a further advantage of the present invention that it can provide a vapor source in any orientation, which is frequently not possible with prior-art devices.

It is a further advantage of some embodiments of this invention that it can remove adsorbed gases from the particulate material through the use of heat and vacuum as a much smaller quantity of material is conveyed through the device.

BRIEF DESCRIPTION OF THE DRAWINGS

FIG. 1 is a cross-sectional view of a prior-art vaporization device;

FIG. 2 is a three-dimensional view of one embodiment of an apparatus according to the present invention for vaporizing organic particulate materials and condensing them onto a surface to form a layer;

FIG. 3 is a cross-sectional view of one embodiment of a portion of the above apparatus for feeding particulate material according to the present invention, including one embodiment of an agitating device useful in the present invention;

FIG. 4 is a cross-sectional view of one embodiment of a portion of the above apparatus for feeding and vaporizing organic particulate material according to the present invention;

FIG. 5 shows a graphical representation of vapor pressure vs. temperature for two organic particulate materials;

FIG. 6*a* is a cross-sectional view showing one embodiment of an auger structure useful in this invention;

FIG. 6*b* is a cross-sectional view of the terminal end of the auger structure in FIG. 6*a*;

FIG. 6*c* is a relief view showing another embodiment of an auger structure useful in this invention;

FIG. 6*d* is a cross-sectional view showing another embodiment of an auger structure useful in this invention;

FIG. 7 is a cutaway view of another embodiment of an agitating device useful in the present invention;

FIG. 8 is a cutaway view of another embodiment of an agitating device useful in the present invention;

FIG. 9 is a three-dimensional view of a portion of another embodiment of an apparatus according to the present invention for vaporizing particulate organic materials and condensing them onto a surface to form a layer, including an apparatus to drive off adsorbed gasses or impurities;

FIG. 10 is a cross-sectional view of a device according to the present invention including a deposition chamber enclosing a substrate;

FIG. 11 is a cross-sectional view of an OLED device structure that can be prepared with the present invention;

FIG. 12 is a three-dimensional view of a materials delivery apparatus for use with the deposition apparatus of the present invention;

FIG. 13 is an isometric cross-sectional view of a materials delivery apparatus showing a replaceable supply cartridge;

FIG. 14 is a close-up view of the replaceable supply cartridge of FIG. 13;

FIG. 15 is an isometric cross-sectional view of a materials delivery apparatus showing the replaceable supply cartridge seated in position on the materials delivery apparatus;

FIG. 16 is a cross-sectional side view of a modular supply and feed cartridge according to another embodiment;

FIG. 17 is a cross-sectional side view of a modular supply and feed cartridge with its feed valve opened;

FIG. 18 is a three-dimensional view of the modular supply and feed cartridge;

FIG. 19 is a cutaway isometric view of the modular supply and feed cartridge;

FIG. 20 is an isometric view of a cartridge receiver within the materials delivery apparatus of the present invention;

FIG. 21 is a three-dimensional view of a materials delivery apparatus for use with the deposition apparatus of the present invention, according to an alternate embodiment;

FIG. 22 is a cutaway isometric view of the modular supply and feed cartridge in an alternate embodiment;

FIG. 23 is a three-dimensional view of a cartridge receiver within the materials delivery apparatus in an alternate embodiment; and, FIG. 24 is an isometric cross-section view of the cartridge receiver shown in FIG. 23.

FIG. 25 is an isometric view of an alternate embodiment of the modular supply and feed cartridge; and FIG. 26 is an isometric cross section view of the modular supply and feed cartridge shown in FIG. 25

DETAILED DESCRIPTION OF THE INVENTION

Figure 2:
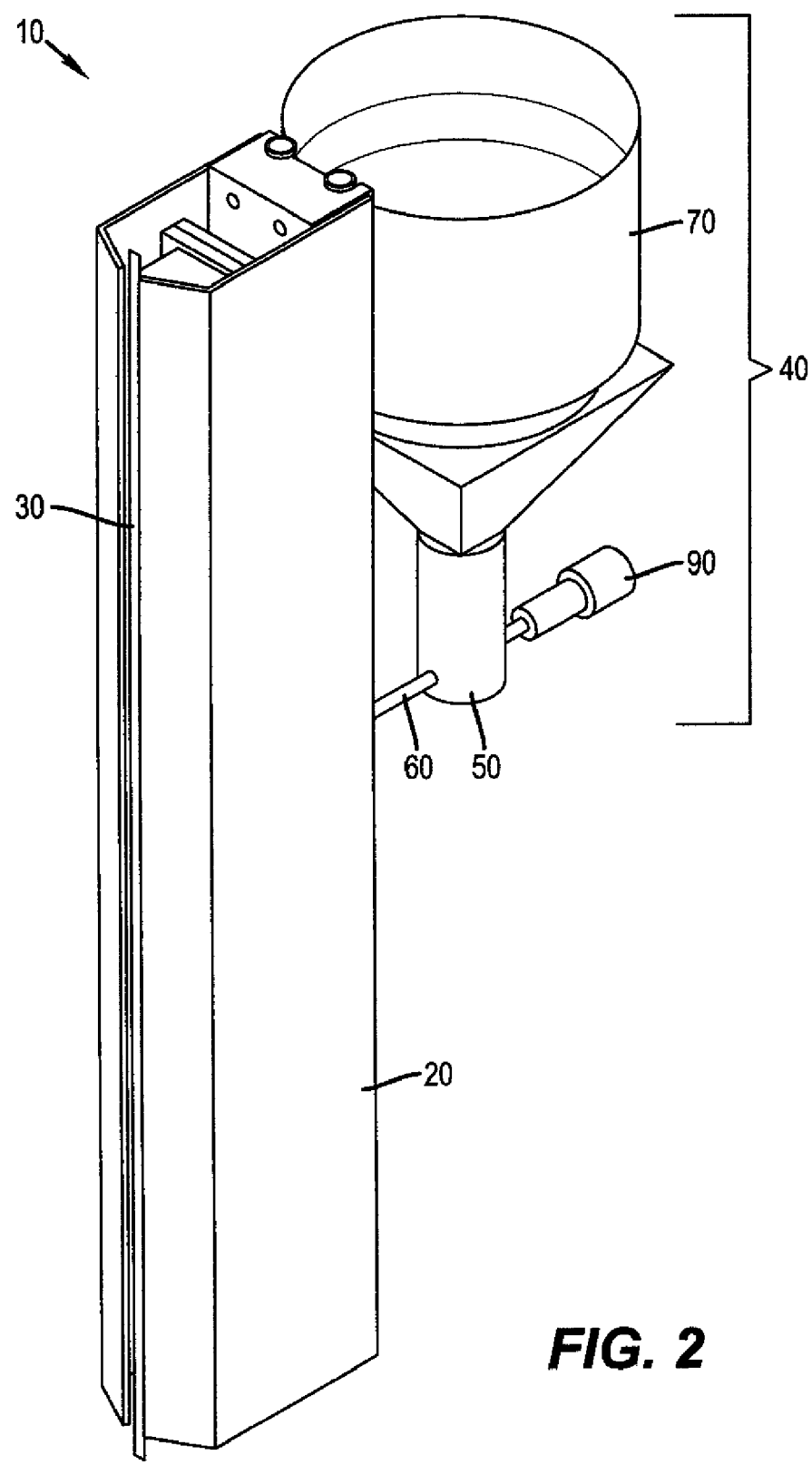

Turning now to FIG. 2, there is shown a three-dimensional view of one embodiment of an apparatus according to the present invention for vaporizing organic particulate materials and condensing them onto a surface to form a layer. Vaporization apparatus 10 includes manifold 20 and attached feeding apparatus 40. Feeding apparatus 40 includes at least first container 50 and feeding path 60, and can also include second container 70. First container 50 is provided with a quantity of organic material in a particulate form, such as a powder in one embodiment. Second container 70 can receive the organic particulate material and transfer it to first container 50 as will become evident. Manifold 20 includes one or more apertures 30 through which vaporized organic material can exit to be deposited on a substrate surface. Manifold 20 is shown in an orientation whereby it can form a layer on a vertically-oriented substrate, but it is not limited to this orientation. Manifold 20 can be oriented horizontally and can form a layer on a horizontal substrate. Manifold 20 had been described in detail by Long et al. in commonly-assigned, above-cited U.S. patent application Ser. No. 10/784,585. Feeding apparatus 40 is shown attached to the bottom of manifold 20, that is, opposite to apertures 30, but feeding apparatus 40 can also be attached to a side of manifold 20. The nature of the attachment of feeding apparatus 40 to manifold 20 will become clear.

Figure 3:
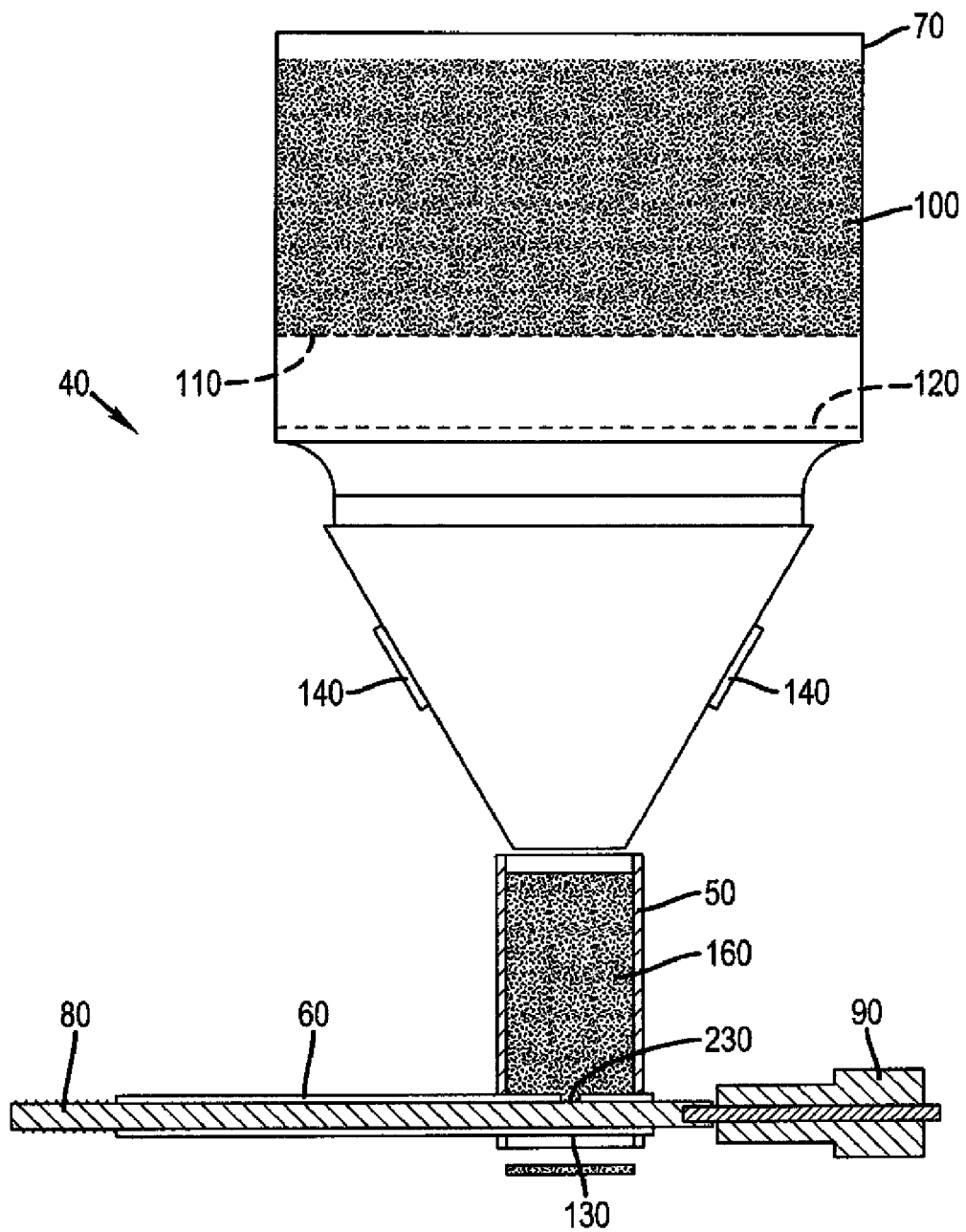

Turning now to FIG. 3, there is shown a cross-sectional view of one embodiment of a portion of the above vaporization apparatus for feeding particulate material according to the present invention whereby organic material is effectively fluidized and transferred to the auger structure. First container 50 holds organic particulate material 160, which is in the form of a finely divided powder and is desirably of a uniform size, and which feeds into auger structure 80 in feeding path 60. Auger structure 80 passes through the interior of first container 50 and feeds into the manifold described above (not shown for clarity). At least a portion of auger structure 80 is rotated by motor 90 so as to transfer the organic particulate material at a controlled volumetric rate or pressure along feeding path 60 to a vaporization zone where the organic component material is vaporized and subsequently delivered to a substrate to form a layer. Feeding path 60, and therefore organic particulate material 160 flowing in feeding path 60, can be maintained at a temperature below the desired vaporization temperature of the organic component material. To facilitate the movement of organic particulate material 160 to auger structure 80, organic particulate material 160 may be fluidized by agitating organic particulate material 160 by using an agitating device, e.g. piezoelectric structure 130 or an electromechanical vibrator. Such fluidized material is more readily transferred to auger structure 80 by gravity feed.

The addition of optional second container 70 to hold additional organic particulate material 100 provides several additional advantages. A large quantity of organic particulate material 100 can be charged in the apparatus, allowing continuous operation of the device for extended periods of time. By sensing the quantity of organic particulate material 160 in first container 50, e.g. by measuring the height of the column of organic particulate material 160, one can selectively meter the amount of organic particulate material 100 transferred from second container 70 to first container 50 and provide a substantially constant volume of organic particulate material 160 in first container 50, e.g. ±5 $cm^3$. In practice, 10 $cm^3$ of organic particulate material 160 is loaded in first container 50. Some embodiments described herein have great process latitude with respect to reliable organic particulate material 160 feeding over a wide range of material height in the container and can be run nearly to exhaustion without failing to feed additional organic particulate material 160. However, it is believed that multi-component mixing homogeneity is fostered if an optimum material height is established and maintained in first container 50 to within ±10%. This minimizes variations in the feeding rate of organic particulate material 160 to feeding path 60. Also, second container 70 can be arranged to be refillable without affecting the operation of first container 50, allowing the device to be continuously operated for even longer periods of time. Organic particulate material 100 is maintained in second container 70 by e.g. screens 110 and 120, whose mesh size is chosen to prevent the free flow of powdered material. Screens 110 and 120 can also be the mechanism for providing measured quantities of organic particulate material 100 to move from second container 70 to first container 50. Screens 110 and 120 may be contacted by agitating devices (not shown) that can be actuated to cause a quantity of organic particulate material 100 to pass through the screen mesh. Such devices include those to vibrate the screen, or a movable arm immediately above or below the screen to allow selective agitation of screens 110 and 120. A commercial flour sifter is one such device well adapted for use in this application. In these sifters, three screens are used and the top surface of each screen is contacted by rotatable arms that extend radially from the center of the sifter. The arms have a V shaped cross section so as to force the powdered organic particulate material 100 into a converging space between the arm and the screen as the arm rotates to thereby force a controlled volume of powdered organic particulate material 100 through the screen. A sensing system based on the height of organic particulate material 160 in first container 50 (or on an integrated signal derived from the deposition rate and time of operation) can serve to actuate the devices agitating screens 110 and 120 so as to maintain a nearly constant volume of powdered organic particulate material 160 in first container 50. Agitating devices such as piezoelectric structures 140 prevent the buildup of organic particulate material 100 in the feed path to first container 50. Piezoelectric structures can be vibrated with multiple frequencies, e.g. a siren effect, to prevent the buildup of organic particulate material 100 at vibrational nodes.

For proper operation of feeding apparatus 40, it is important to maintain a uniform feed rate of organic particulate material 160. Organic particulate material 160 is generally provided in a powdered form. One important strategy for providing a free flow of organic particulate material 160 is to prevent bridging, a characteristic behavior of particulate materials such as powders that can occur when the powder particles self-assemble into a load-bearing structure about an opening or aperture and thereby obstruct the flow of powder through the opening. Bridging effects can occur, for example, when the dimensions of an aperture are too small to overcome a tendency of a particulate material to resist flow. Factors that may cause bridging can include particulate size relative to the aperture dimensions, humidity, electrostatic attraction between particles, vacuum levels, and friction. To alleviate this problem, the dimensions of an opening 230 at the interface of first container 50 and feeding path 60, as shown in FIG. 3, must be sufficiently sized to overcome the bridging characteristics of the powdered material. This sizing requirement is best determined empirically, taking into account worst-case conditions for the particular organic particulate material 160 that must be supplied, in a free flowing manner, to feeding path 60. Maintaining a nearly constant volume of organic particulate material 160 in first container 50 also helps to promote a constant feed rate of organic particulate material 160 to auger structure 80. By properly sizing opening 230 and maintaining a sufficient volume of organic particulate material 160 in first container 50, a uniform feed rate can be achieved for many types of powdered organic particulate material 160, providing a fluidized flow without requiring any supplemental form of agitation in some cases.

Where the opening 230 must be narrow, feed rate uniformity can be assured when the organic particulate material 160 in proximity to the infeed portion of the screw auger is maintained in a fluidized state by an agitating device. This can be accomplished by slowly agitating organic particulate material 160 immediately above the auger screw or by inducing vibration, e.g. by piezoelectric structure 130, into organic particulate material 160 that is tuned to induce liquid-like behavior of the powdered organic particulate material 160 but is not so energetic as to cause gas-like behavior.

Figure 4:
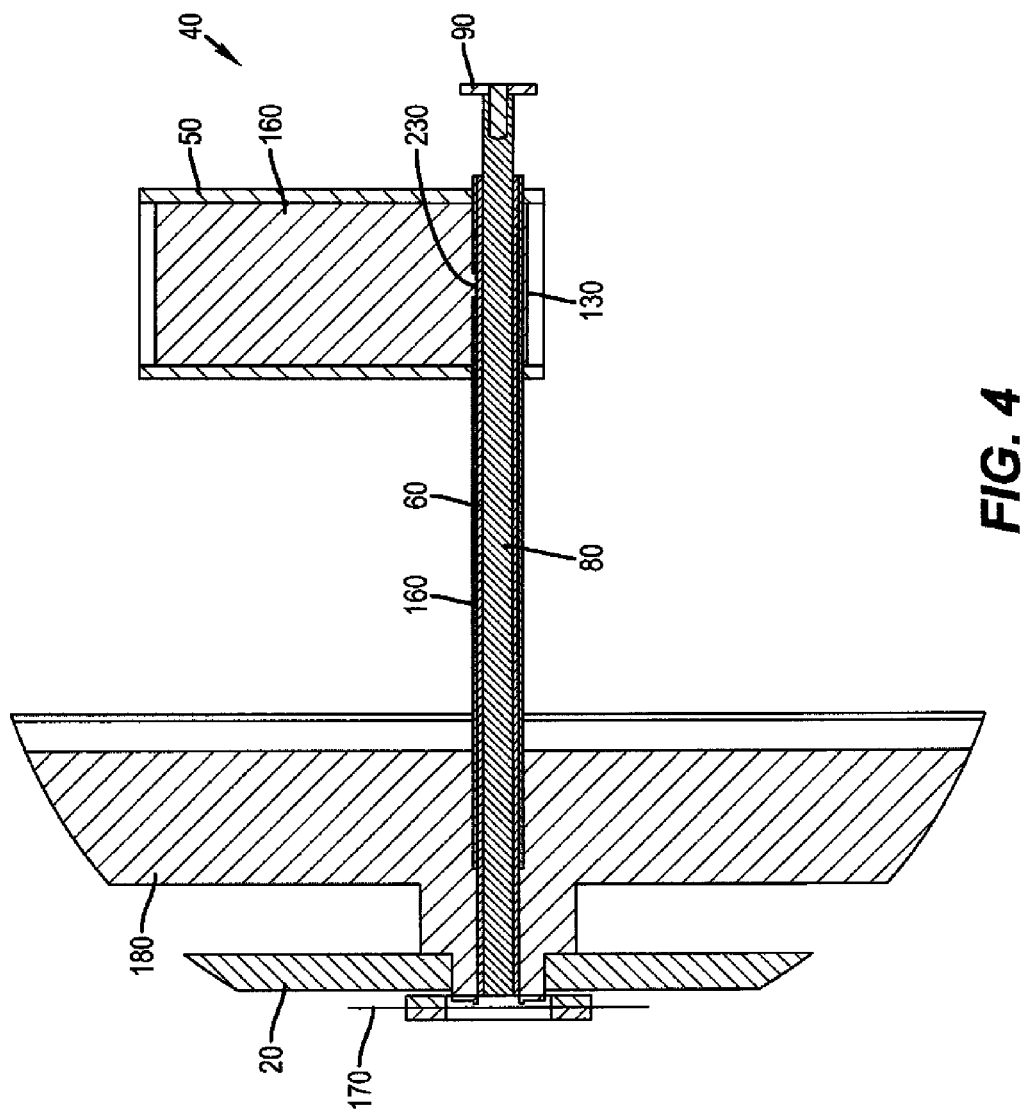
Figure 5:
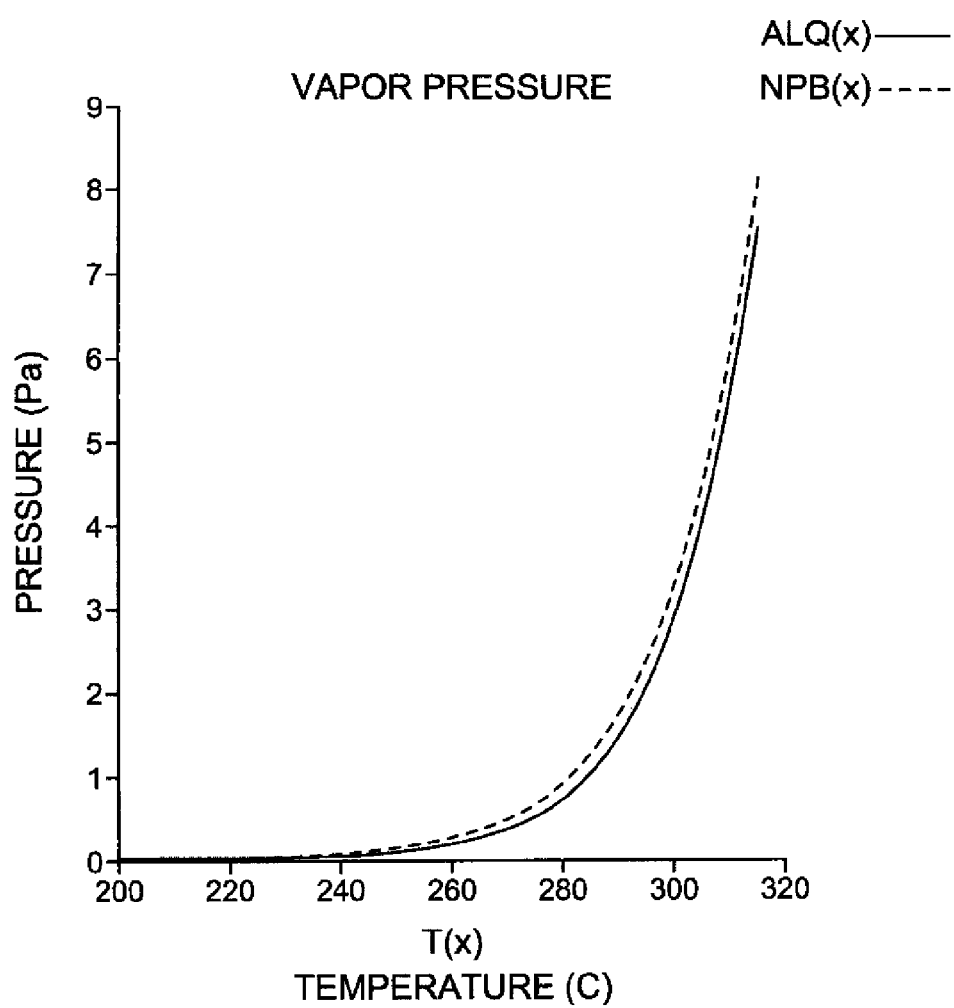

Turning now to FIG. 4, there is shown in further detail a cross-sectional view of one embodiment of a portion of the above apparatus for feeding and vaporizing organic particulate material 160 according to the present invention. Auger structure 80 transfers powdered organic particulate material 160 along feeding path 60 into manifold 20 and heating element 170. Heating element 170 can be e.g. a heated screen and has been previously described in detail by Long et al. Manifold 20 includes a vaporization zone which is defined as the region of feeding path 60 immediately adjacent to heating element 170. A thin cross-section of powdered organic particulate material 160 is heated to the desired rate-dependent temperature, which is the temperature of heating element 170, by virtue of contact and thermal conduction, whereby the thin cross-section of powdered organic particulate material 160 vaporizes to be delivered to a substrate surface to form a layer. The auger structure 80 and its rotation rate control the rate at which organic particulate material 160 is fed to heating element 170. This linearly controls the rate of vaporization and therefore the rate at which organic particulate material 160 leaves the manifold in the vapor state. Thus the feed rate of the organic particulate material 160 to the auger structure 80 and to the vaporization zone controls the deposition rate of the vaporized organic particulate material 160 onto the desired surface.

Additionally, base 180 can be included. Base 180 is a heat-dissipating structure to prevent much of the heat from heating element 170 from traversing the length of feeding path 60, and thus keeps the bulk of the organic particulate material 160 significantly cooler than the conditions it experiences in the vaporization zone immediately adjacent to heating element 170. Means of heat dissipation for base 180 have been described by Long et al. in commonly-assigned, above-cited U.S. patent application Ser. No. 10/784,585. A steep thermal gradient thereby created protects all but the immediately vaporizing material from the high temperatures. The vaporized organic vapors rapidly pass through heating element 170 and can enter into the heated manifold 20. The residence time of organic particulate material 160 at the desired vaporization temperature is very short and, as a result, thermal degradation is greatly reduced. The residence time of the organic particulate material 160 at elevated temperature, that is, at the rate-dependent vaporization temperature, is orders of magnitude less than with prior art devices and methods (seconds vs. hours or days in the prior art), which permits heating organic particulate material 160 to higher temperatures than in the prior art. Thus, the current device and method can achieve substantially higher vaporization rates, without causing appreciable degradation of the components of organic particulate material 160.

The organic particulate material 160 can include a single component, or can include two or more different organic material components, each one having a different vaporization temperature. The vaporization temperature can be determined by various means. For example, FIG. 5 shows a graphical representation of vapor pressure versus temperature for two component organic materials commonly used in OLED devices. The vaporization rate is proportional to the vapor pressure, so for a desired vaporization rate, the data in FIG. 5 can be used to define the required heating temperature corresponding to the desired vaporization rate. In the case where the organic particulate material 160 includes two or more organic components, the temperature of heating element 170 is chosen such that the vaporization is feed-rate limited, that is, the vapor pressure at the heating element temperature is substantially above the desired partial pressure of that component in the manifold, so that each of the organic material components simultaneously vaporizes.

Pressure develops in manifold 20 as vaporization proceeds, and streams of vapor exit manifold 20 through the series of apertures 30 shown in FIG. 2. Because only a small portion of organic particulate material 160—the portion resident in the vaporization zone—is heated to the rate-dependent vaporization temperature, while the bulk of the material is kept well below the vaporization temperature, it is possible to interrupt the vaporization by a means for interrupting heating at heating element 170, e.g. stopping the movement of auger structure 80. This can be done when a substrate surface is not being coated so as to conserve organic particulate material 160 and minimize contamination of any associated apparatus, such as the walls of a deposition chamber, which will be described below.

Because heating element 170 can be a fine mesh screen that prevents powder or compacted material from passing freely through it, the manifold can be used in any orientation. For example, manifold 20 of FIG. 2 can be oriented downwards so as to coat a substrate placed below it. This is an advantage not found using the heating boats of the prior art.

Turning now to FIG. 6*a*, there is shown a cross-sectional view of one embodiment of an auger structure 80 useful in this invention. The auger structure 80 includes an auger screw 85 that is turned by motor 90. The distance between the threads of the screw helix and the thread height are chosen to be sufficiently large that powdered organic particulate material 160 tends not to pack into and rotate with the helix, but rather to remain at the bottom of a horizontally oriented auger tube and be transported linearly by virtue of the relative motion between the auger screw 85 and the auger tube. For example, an auger screw 85 with a 2.5 mm pitch screw lead and a 0.8 mm thread height has been found to be an effective combination in transporting and consolidating powdered organic particulate material 160 in a horizontal orientation.

The inventors have found that auger dimensions have an affect on maintaining a uniform flow rate. Similar to the bridging effects noted above with respect to the size of opening 230, proper auger sizing and screw thread pitch is best determined empirically, considering worst-case conditions for the particular composition of organic particulate material 160.

The inventors have also found that the angle of auger screw threads can be optimized to facilitate free flow of organic particulate material 160 along feeding path 60. While optimal screw thread angle may vary somewhat depending on the particular component materials of powdered organic particulate material 160, it has been determined that screw thread angles ranging from not less than about 4 degrees to no more than about 15 degrees relative to the rotational axis of auger structure 80 provide optimal flow conditions for the organic materials 160 that are conventionally used.

Various materials and surface treatments of the auger shaft have been found to facilitate auger operation, allowing increased feed rates. While stainless steel may provide acceptable performance, additional benefit may be obtained by surface treatments such as electropolishing or by coatings, such as a coating of titanium nitride.

While continuous auger rotation at a sustained rate may provide an acceptable level of performance, added benefits may be obtained by pulsing the auger, providing rotation of the auger shaft in a repeated incremental fashion. A pulsing action reduces the tendency for powdered organic particulate material 160 to rotate with the auger screw by reducing the effective coefficient of friction between the auger screw and the particulate material. The powder feeding efficiency of auger structure 80 is thereby improved. Pulsing behavior may also be advantageous where it becomes useful to vary the feed rate over an interval, for example.

In the horizontal orientation, the organic particulate material 160 travels along the bottom of auger screw 85 in a tumbling and dispersed form. At the terminal end of auger screw 85, a powder pressure of 1 Mpa can be developed that increases the bulk density of the organic particulate material 160 to the point where it serves as a vapor seal, preventing vaporized material in the manifold having a pressure greater than the ambient vacuum level from flowing back along the auger screw to its source at first container 50. As shown in FIG. 6b, the terminal end of auger screw 85 is configured to have a thread-free portion 135 having a constant circular cross section over a small length to constrain the consolidated powdered organic particulate material 160 to form a narrow annular or tubular shape. This narrow annular shape substantially improves the thermal contact and temperature uniformity through the organic particulate material 160, between the temperature-controlled auger screw 85 and the temperature-controlled feeding path 60. This configuration additionally assures good temperature uniformity of the organic particulate material 160 at a given transverse cross section relative to a circular cross section and substantially increases the attainable temperature gradient in the organic particulate material 160 between the auger structure 80 and the heating element 170. The powdered organic particulate material 160 is extruded from the auger structure in a tubular shape and is sufficiently consolidated that it can maintain the tubular extruded form for at least several millimeters upon exiting the support of the auger tube. This solid form prevents pressurized vapor, resulting from organic material vaporization, from flowing back into the auger structure 80 and enables the powdered organic particulate material 160 to bridge the short gap between the end of the temperature-controlled auger structure and the heating element.

The present invention is not limited to auger screws (85) for translating or delivering received organic material to a vaporization zone. Other arrangements can also be used such as, a mechanism for projecting received materials along the path into the vaporization zone such as shown in commonly assigned U.S. 2005/028220, the disclosure of which is incorporated by reference or providing a movable surface for the received material. The move able surface can be provided on a belt or disk such as shown in commonly assigned U.S. patent application Ser. Nos. 11/050,934 and 11/153,066, the disclosures of which are incorporated by reference. Thermal modeling of a powder dispensing system having this annular configuration where the heating element is spaced 130 µm from the end of the auger structure 80 indicates that an average axial thermal gradient of 0.5° C./µm can be achieved through the organic particulate material 160 spanning the heating element 170 and the terminal end of the auger structure 80 when the temperature differential between the two is 270° C. There can therefore be a 100° C. temperature drop through the first 200 µm of consolidated powdered organic particulate material 160. This gradient prevents the usual leaching of more volatile constituents from bulk volumes of mixed-component organic materials and enables a single source to co-deposit multiple component organic materials. This large gradient is further instrumental in maintaining the organic particulate material 160 in a consolidated powder form at the exit of the auger tube even when component organic materials that liquefy before vaporizing are employed.

Figure 6A:
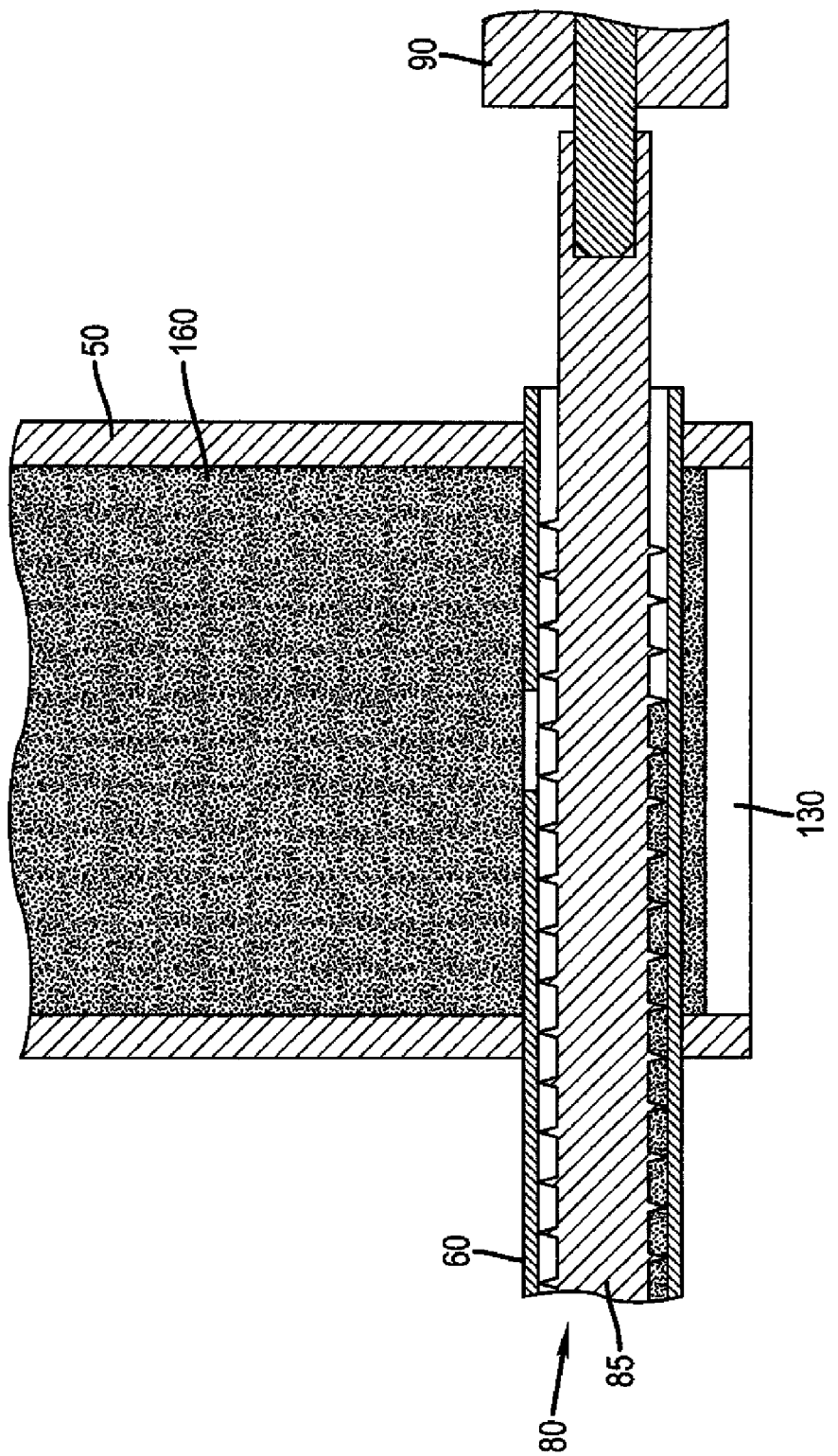
Figure 6B:
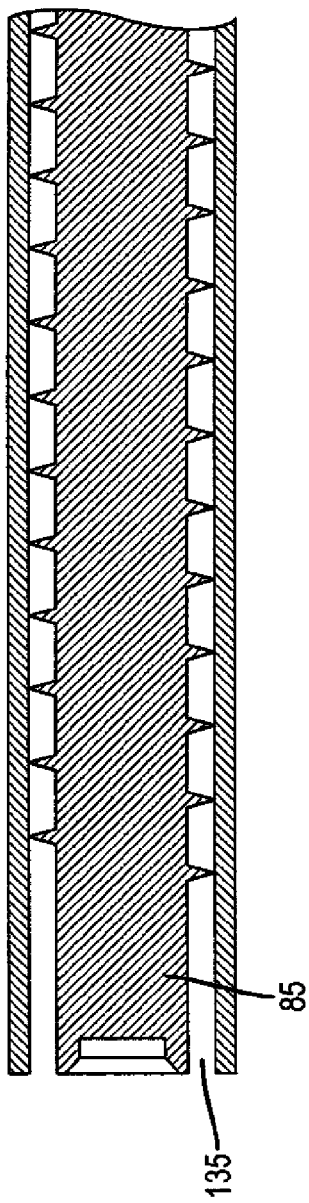
Figure 6C:
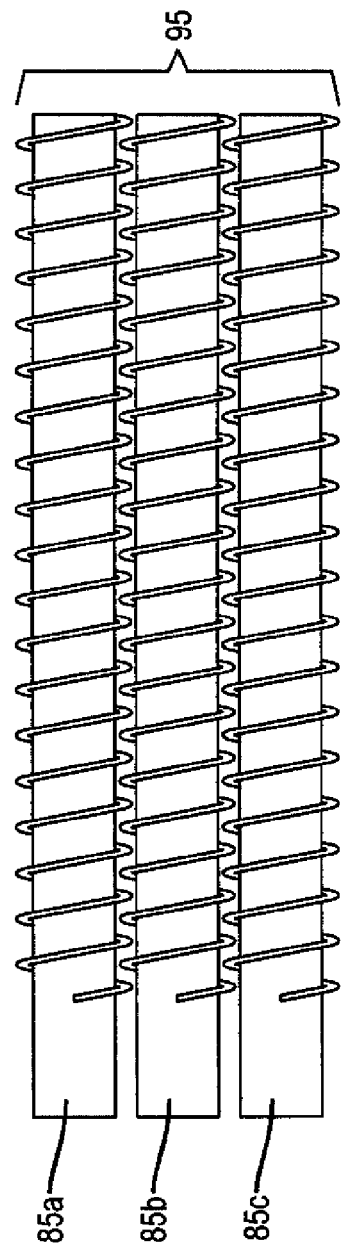

The auger structure 80 shown in FIG. 6a is effective at transporting powdered organic particulate material 160 horizontally, but is not as effective in transporting powdered organic particulate material 160 vertically, since the powdered organic particulate material 160 tends to simply rotate with the screw and not advance along the length of the structure. Turning now to FIG. 6c, there is a relief view of another embodiment of an auger structure useful in this invention. In this embodiment, auger structure 95 includes two or more auger screws, e.g. auger screws 85a, 85b, and 85c, with identical interlaced helical threads. All of the auger screws 85a, 85b, and 85c rotate in the same direction. Organic material that is packed between the threads of one auger screw, e.g. 85a, will be removed as the material rotates into contact with the interlaced thread of the second rotating auger screw, e.g. 85b, because the facing portions of adjacent screws move in opposite directions. Auger structure 95 thus overcomes the orientation restrictions of the single-screw auger structure of FIG. 6a while retaining the ability to consolidate the powdered organic particulate material 160 into a solid shape and to form a vapor seal. The discharge portion of auger structure 95 would have an elongated cross-section that can extend across the entire length of the manifold so as to inject material substantially uniformly along its length.

Figure 6D:
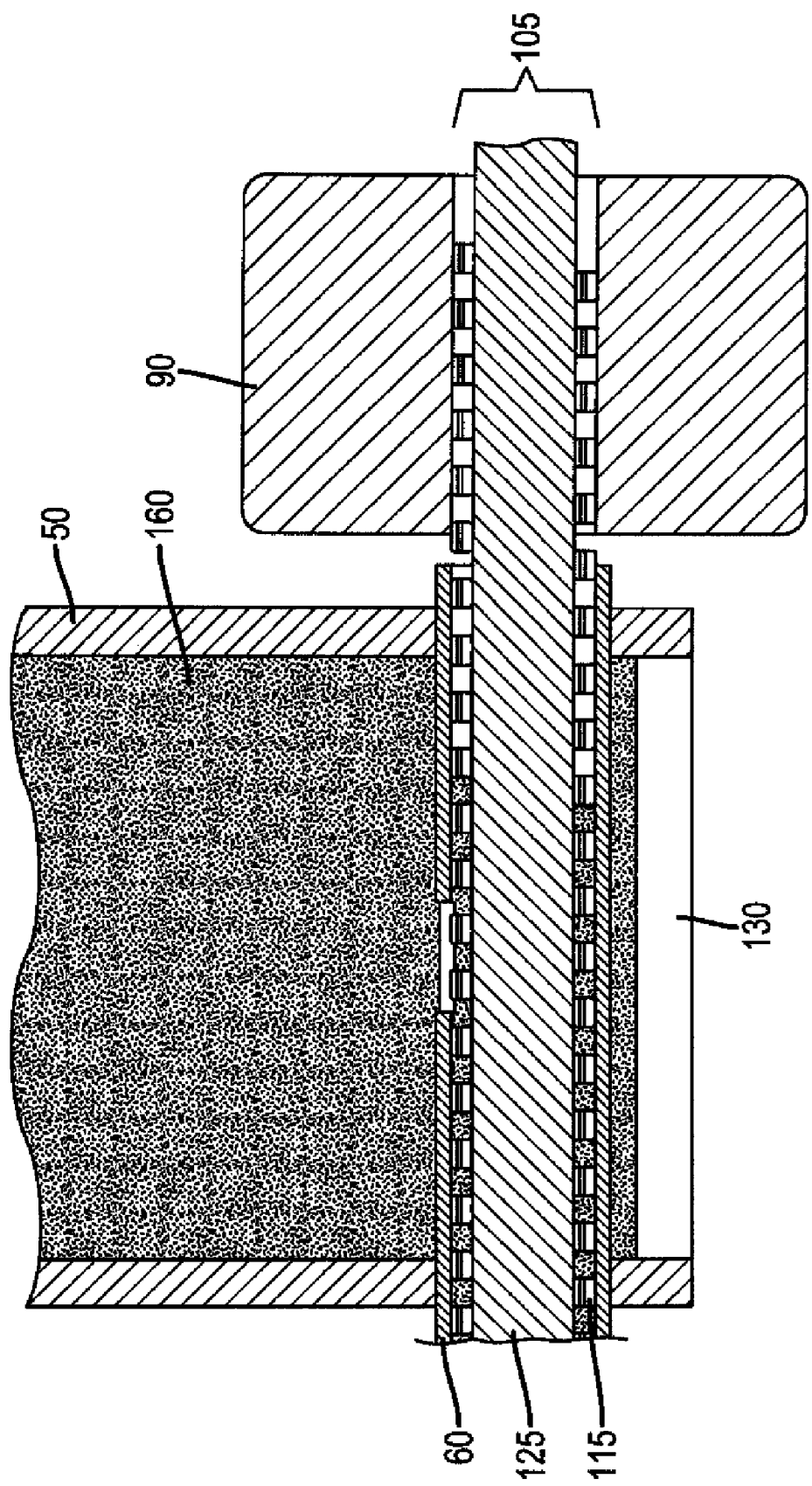

Turning now to FIG. 6d, there is a cross-sectional view of another embodiment of an auger structure useful in this invention. Auger structure 105 includes a rotating helical thread 115, a stationary center portion 125, and a stationary outer tube, which in this case is feeding path 60. In this embodiment, only a portion of auger structure 105—the portion comprising helical threads 115—rotates and is turned by motor 90. Powdered organic particulate material 160 feeding with circular cross section helical threads has been demonstrated. The thread consisted of a steel wire 0.7 mm diameter formed into a helix of 5 mm outside diameter and 2.5 mm pitch. Smooth wires of other materials such as titanium and stainless steel are also suitable. The wire can also have a non-circular cross section, with a rectangular cross section being particularly advantageous as it provides additional rigidity to prevent the helical thread from changing dimensions as it encounters torsional resistance while pushing the powdered organic particulate material 160. Stationary center portion 125, in cooperation with feeding path 60, substantially prevents all but a thin film of powdered organic particulate material 160 from rotating with the auger. Auger structure 105 does not rely on gravity to accumulate powdered organic particulate material 160 and will operate in any orientation. Auger structure 105 also consolidates the powdered organic particulate material 160 into a thin annular shape that substantially improves the thermal contact between the powdered organic particulate material 160 and temperature-controlled feeding path 60 and stationary center portion 125. These characteristics are significant in enabling the controlled vaporization of mixed component organic materials, and component organic materials that liquefy before vaporizing. Thus this embodiment overcomes the orientation restrictions of the first auger structure while retaining the ability to consolidate the powdered organic particulate material 160 into a solid shape and form a vapor seal.

Figure 7:
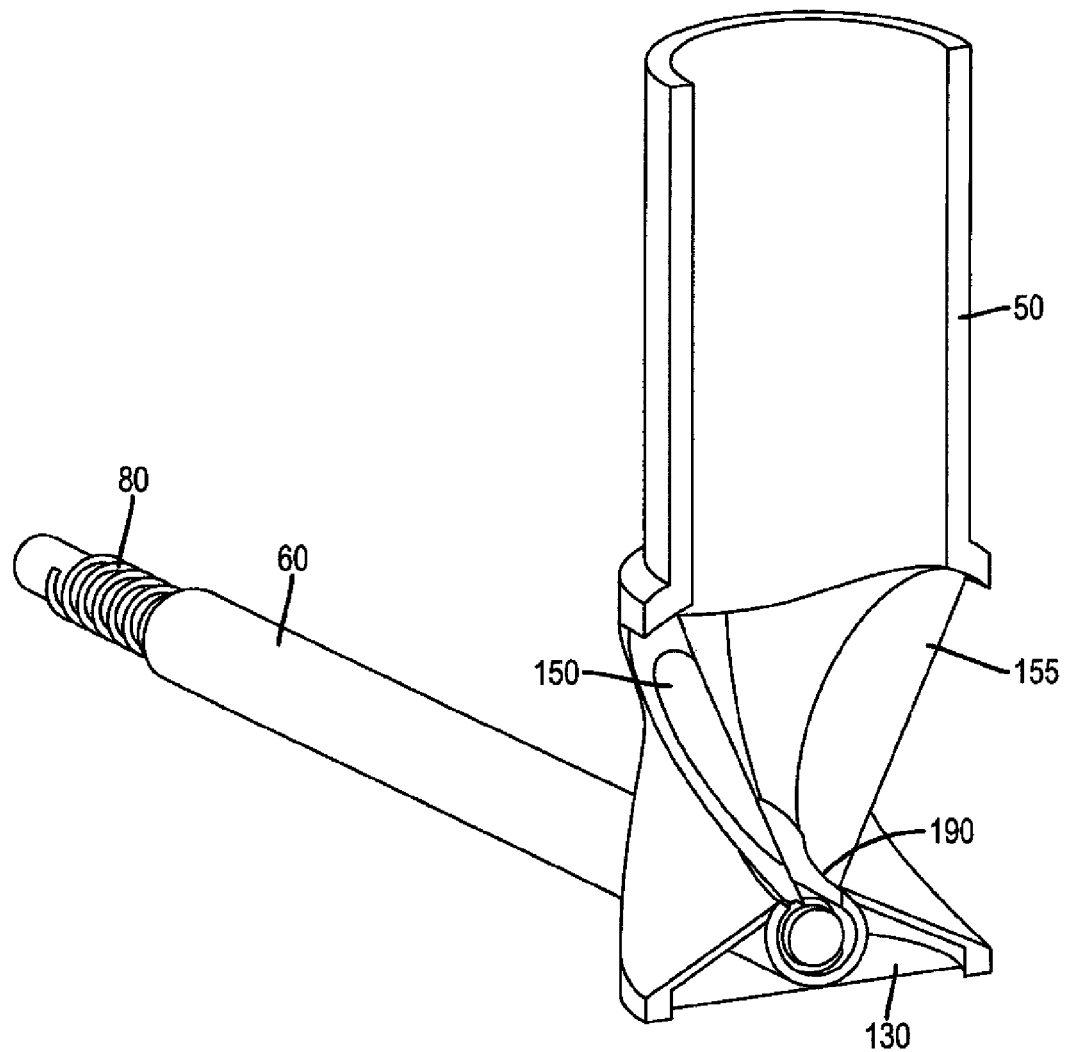

The above embodiments of this invention, based primarily on vaporization apparatus 10 of FIG. 2, are useful at atmospheric pressure and pressures down to about one-half atmosphere. Experimentally, it has been observed that fine powder is considerably more difficult to meter in a partial vacuum below half an atmosphere. The powdered organic particulate material 160 agglomerates as residual air molecules are removed, and undergoes a reduction of the elastic coupling between particles that is effective in communicating vibrational energy through powdered organic particulate material 160 under atmospheric conditions. This effect negatively influences the powder-feeding uniformity of the auger structure. Therefore, a different agitating device can be necessary. Turning now to FIG. 7, there is shown a cutaway view of another embodiment of an agitating device useful in the present invention for overcoming the limitations in low-pressure conditions. This embodiment employs three piezoelectric structures as the agitating device. Piezoelectric structures 150 and 155 are inclined at a steep angle and form opposite walls of a funnel at the bottom of first container 50. The bottom portion 190 of these two piezoelectric structures is not supported and leads directly to the infeed portion of auger structure 80. The unsupported portions of the piezoelectric structures 150 and 155 have high vibration amplitude and are effective in fluidizing powdered organic particulate material 160 in proximity to their surfaces. The third piezoelectric structure 130 is mounted below auger structure 80 and imparts vibration whose amplitude is essentially perpendicular to the vibration of the other two piezoelectric structures 150 and 155. The piezoelectric structures are driven by a frequency sweeping circuit. The changing frequency is instrumental in preventing the formation of nodes and improves the powder feeding efficiency considerably. Auger structure 80 can be any of the above-described auger structures.

Figure 8:
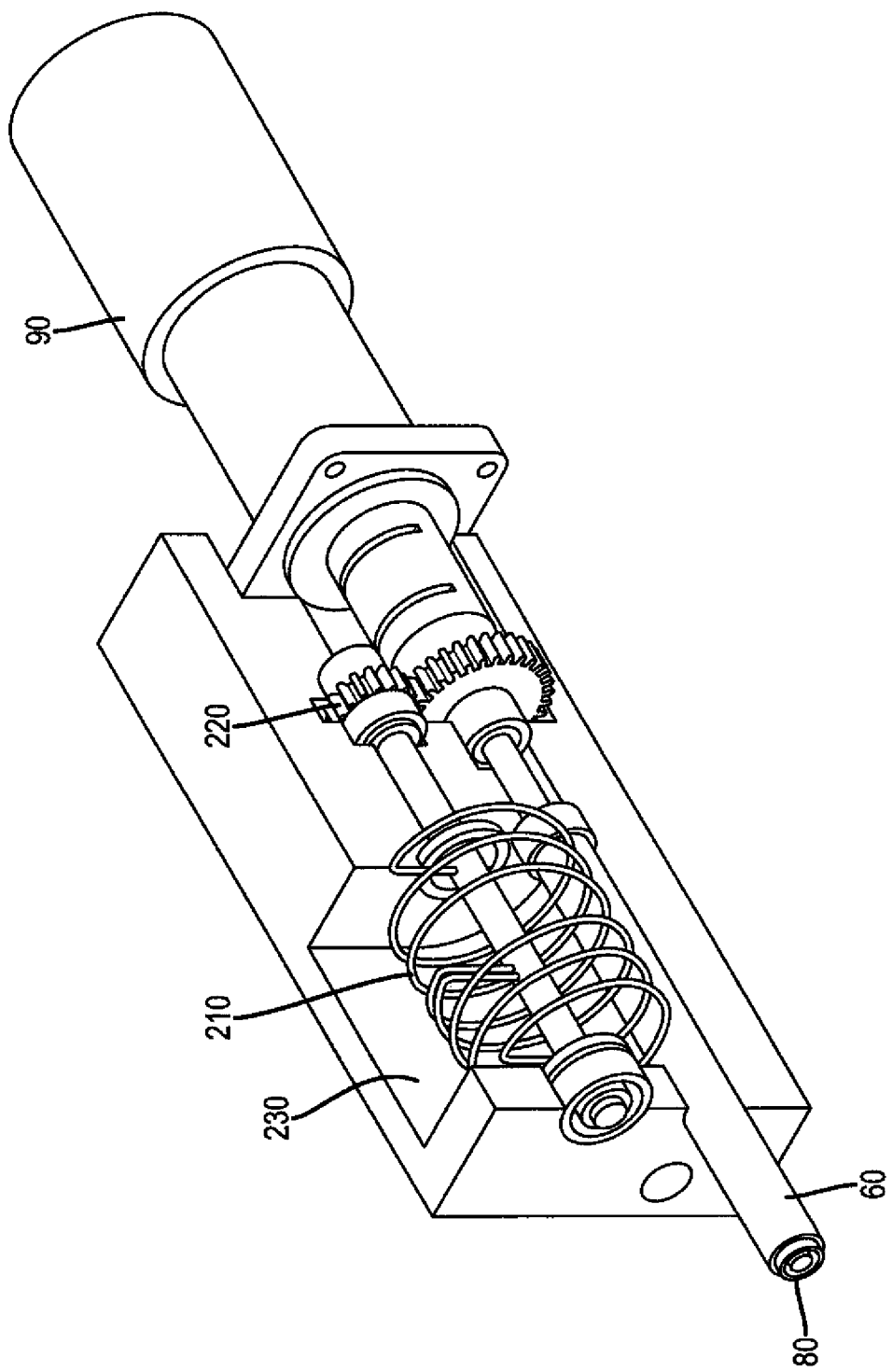

FIG. 8 is a cutaway view of another embodiment of an agitating device useful in the present invention for overcoming the limitations in low-pressure conditions. Opening 230 represents the lower end of the above-described first container 50. Rotating thread type device 210 includes left- and right-hand helically wound wires on a common shaft. Rotating thread type device 210 is positioned above the infeed portion of the auger structure such that the wires are substantially tangent to the threads of auger structure 80. The rotating thread should not interfere with the auger screw threads, but it will continue to operate effectively with as much as 1 mm clearance. Rotating thread type device 210 is slowly rotated via gear drive 220, by motor 90, which also turns auger structure 80. In practice, the rotational speed of the rotating thread type device 210 can vary depending on the particle size and properties of the particular powdered organic particulate material 160, but a practical guide is to have the axial slew rate of the rotating thread match the axial slew rate of the threads of the auger screw. The wires of rotating thread type device 210 tend to push powdered organic particulate material 160 toward the center of opening 230 and prevent powder bridging over auger structure 80. Auger structure 80 can be any of the above-described auger structures. This agitating device is well adapted to feeding mixed-component organic materials as it imparts very little energy to powdered organic particulate material 160 and is therefore not likely to cause particle separation by size or density.

Figure 9:
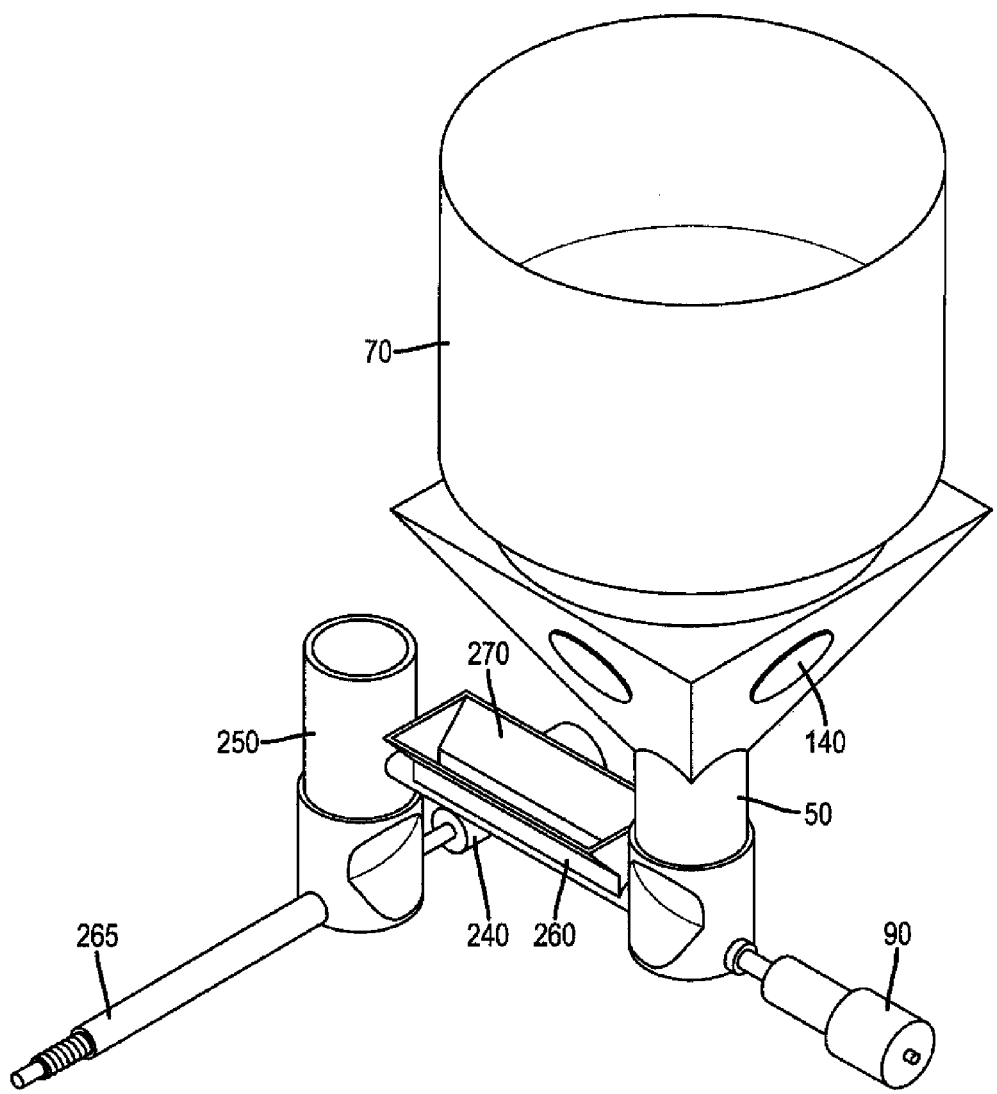

Turning now to FIG. 9, there is shown a three-dimensional view of a portion of another embodiment of an apparatus according to the present invention for vaporizing powdered organic materials 160 and condensing them onto a surface to form a layer, including an apparatus for pre-conditioning organic particulate material 160 to drive off adsorbed gasses or impurities. The apparatus includes first container 50 as described above for holding a quantity of organic particulate material 160. The apparatus can also include a second container 70 for holding a reserve quantity of organic particulate material 100 that can be fed to first container 50. The apparatus can also include agitating devices such as piezoelectric structure 140 to facilitate the movement of organic particulate material 100 from second container 70 to first container 50. Organic particulate material 160 from first container 50 is fed into first feeding, path 260 for pre-conditioning. First feeding path 260 includes an auger structure in association with first container 50 for transferring the organic particulate material 160 from first container 50 to first feeding path 260. At least a portion of the auger structure is turned by motor 240 to feed powdered organic particulate material 160 along first feeding path 260. First feeding path 260 includes vacuum exposure opening 270, which is in communication with a source of partial vacuum. First feeding path 260 can alternately be heated so as to heat the powdered organic particulate material 160 while exposing it to a partial vacuum so as to drive off adsorbed gasses or impurities as the organic particulate material 160 is transferred along first feeding path 260 to the vaporization zone as pre-conditioned organic particulate material 160. For typical deposition rates, the free powdered organic particulate material 160 has several minutes to liberate adsorbed water vapor and gas molecules in this pre-conditioning phase, just prior to being compacted and vaporized. The pre-conditioned powdered organic particulate material 160 is then transferred to second feeding path 265, which is defined by an auger structure as described above, in which it is consolidated, that is, it is compacted and evenly distributed around the auger structure. Powdered organic particulate material 160 is fed along second feeding path 265 by the auger structure to a manifold and vaporization zone (not shown) as described above, where the organic material is vaporized and subsequently condensed onto the surface of an OLED substrate to form an organic layer. Optional third container 250 can receive the exposed powdered organic particulate material 160 from first feeding path 260. In such a case, the auger structure that defines second feeding path 265 is also associated with third container 250 for feeding exposed powdered organic particulate material 160 to second feeding path 265, and such auger structure passes through the interior of third container 250. This apparatus also includes means for fluidizing the powdered organic particulate material 160, as already described. In an alternative embodiment, feeding path 260 includes vacuum exposure opening 270 and feeds directly to a manifold without the use of a second feeding path.

In practice, the apparatus described herein is operated as follows. A powdered organic particulate material 160, which is useful in forming a layer on an OLED device, is provided into second container 70. The organic particulate material 160 is transferred in a controlled manner to first container 50 in such a way as to maintain a substantially constant volume of powdered organic particulate material 160 in first container 50. The powdered organic particulate material 160 is fluidized by means described herein and thereby transferred to an auger structure 80, which transfers the powdered organic particulate material 160 to a vaporization zone as described herein. The organic particulate material 160 is vaporized in the vaporization zone into a manifold 20, which delivers the vaporized organic material to the surface of an OLED substrate to form a layer, as will be described below.

As has been noted hereinabove, vacuum levels may tend to complicate the problem of metering out uniform amounts of finely powdered organic materials 160. Referring back to FIG. 2, it can be observed that a continuous column of organic particulate material 160 is maintained in feeding path 60. In one embodiment, this column of organic particulate material 160, if suitably compacted, can be utilized as a type of vacuum seal, where particulate characteristics of organic particulate material 160 allow. With this arrangement, a high vacuum level can be present for organic particulate material 160 at heating element 170 and in the manifold 20. A lower vacuum level can then be maintained at first container 50, which may even be at atmospheric pressure. Even a partial seal could be advantageous. This sealing effect could also be used to isolate ambient gases used for storage of organic particulate material 160 in first container 50 or for organic particulate material 100 in second container 70. With some materials, for example, it is beneficial to store materials under an inert gas such as argon or helium.

Figure 10:
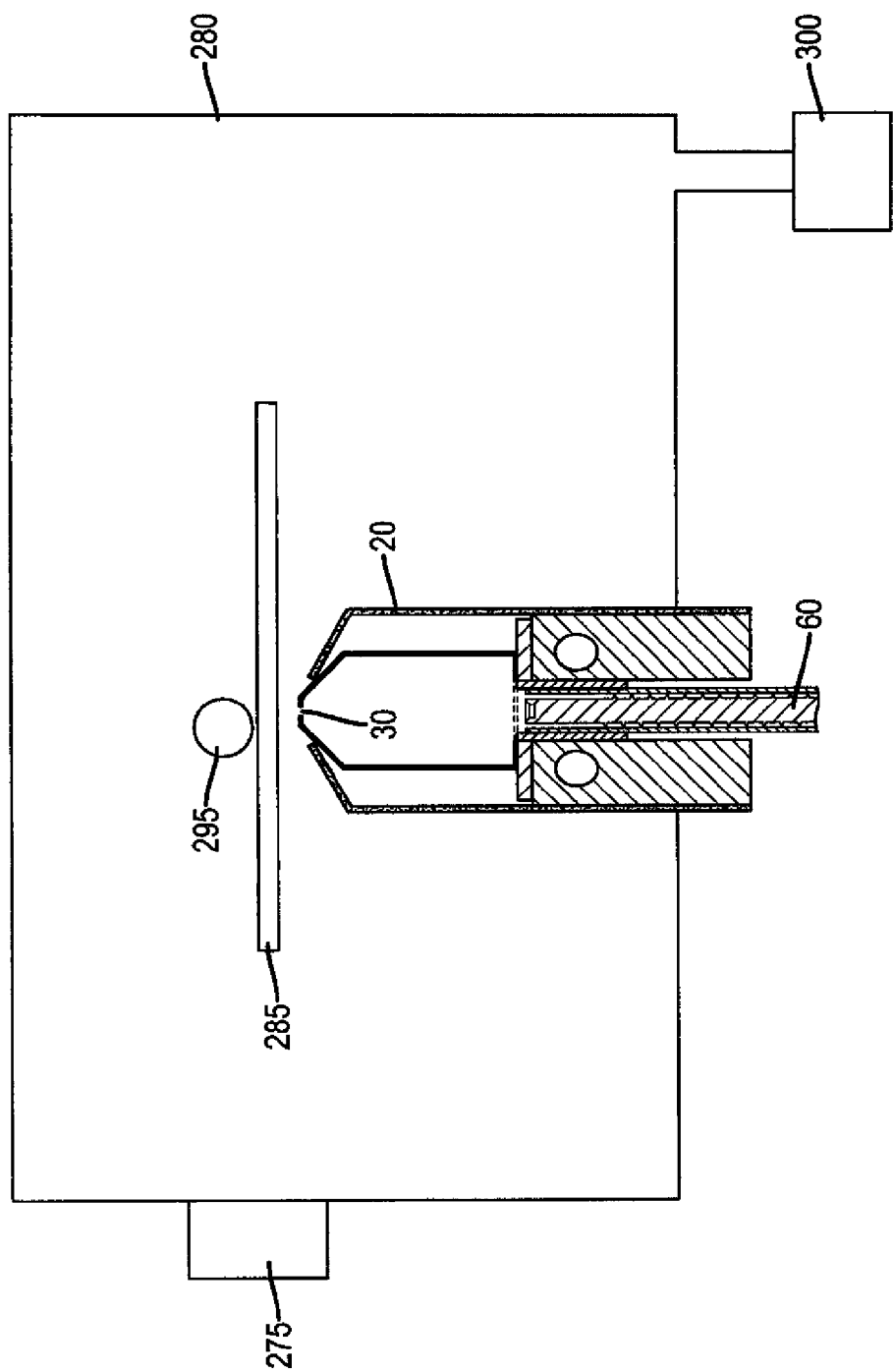

Turning now to FIG. 10, there is shown an embodiment of a device of this disclosure including a deposition chamber enclosing a substrate. Deposition chamber 280 is an enclosed apparatus that permits an OLED substrate 285 to be coated with organic material transferred from manifold 20. Manifold 20 is supplied with organic material via feeding path 60 as described above. Deposition chamber 280 is held under controlled conditions, e.g. a pressure of 1 torr or less provided by vacuum source 300. Deposition chamber 280 includes load lock 275 which can be used to load uncoated OLED substrates 285, and unload coated OLED substrates. OLED substrate 285 can be moved by translational apparatus 295 to provide even coating of vaporized organic material over the entire surface of OLED substrate 285. Although vaporization apparatus is shown as partially enclosed by deposition chamber 280, it will be understood that other arrangements are possible, including arrangements wherein the entire vaporization apparatus, including any container or containers for holding the powdered organic particulate material 160, is enclosed by deposition chamber 280.

In practice, an OLED substrate 285 is placed in deposition chamber 280 via load lock 275 and held by translational apparatus 295 or associated apparatus. The vaporization apparatus is operated as described above, and translational apparatus 295 moves OLED substrate 285 perpendicular to the direction of emission of organic material vapors from manifold 20, thus delivering vaporized organic material to the surface of OLED substrate 285 to condense and form a layer of organic material on the surface.

Figure 11:
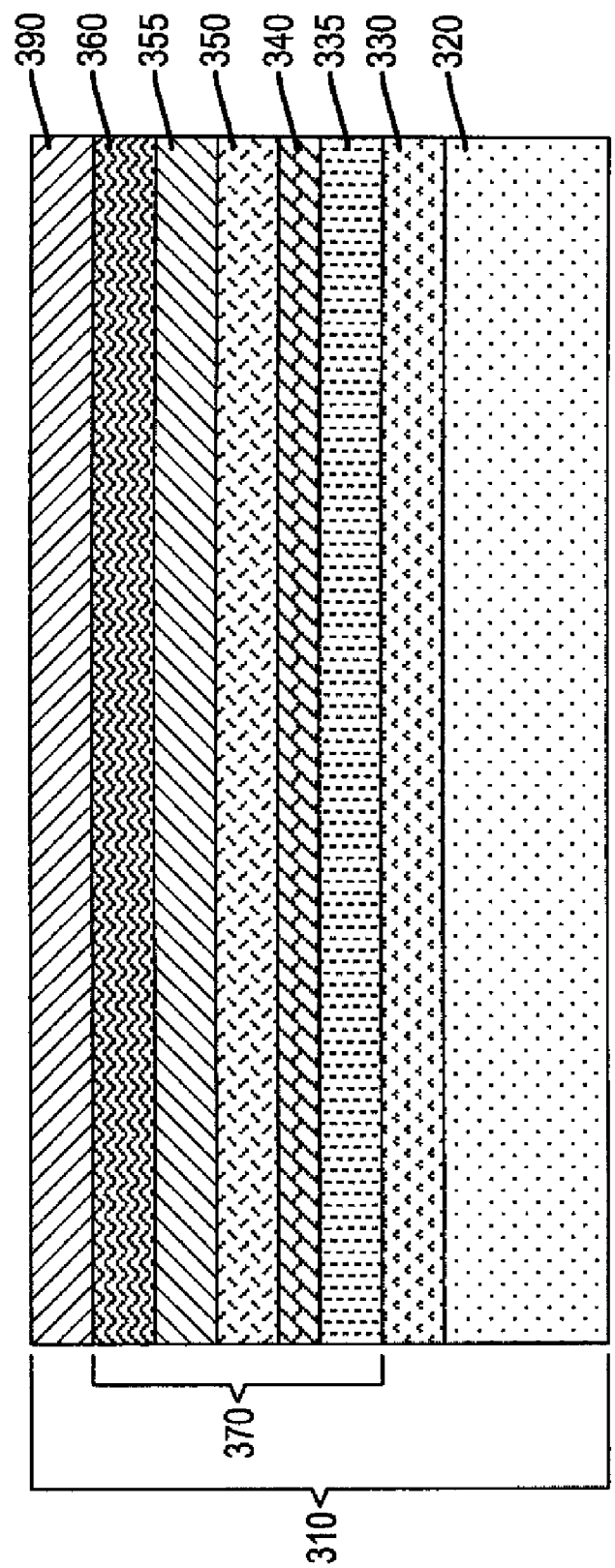
Figure 12:
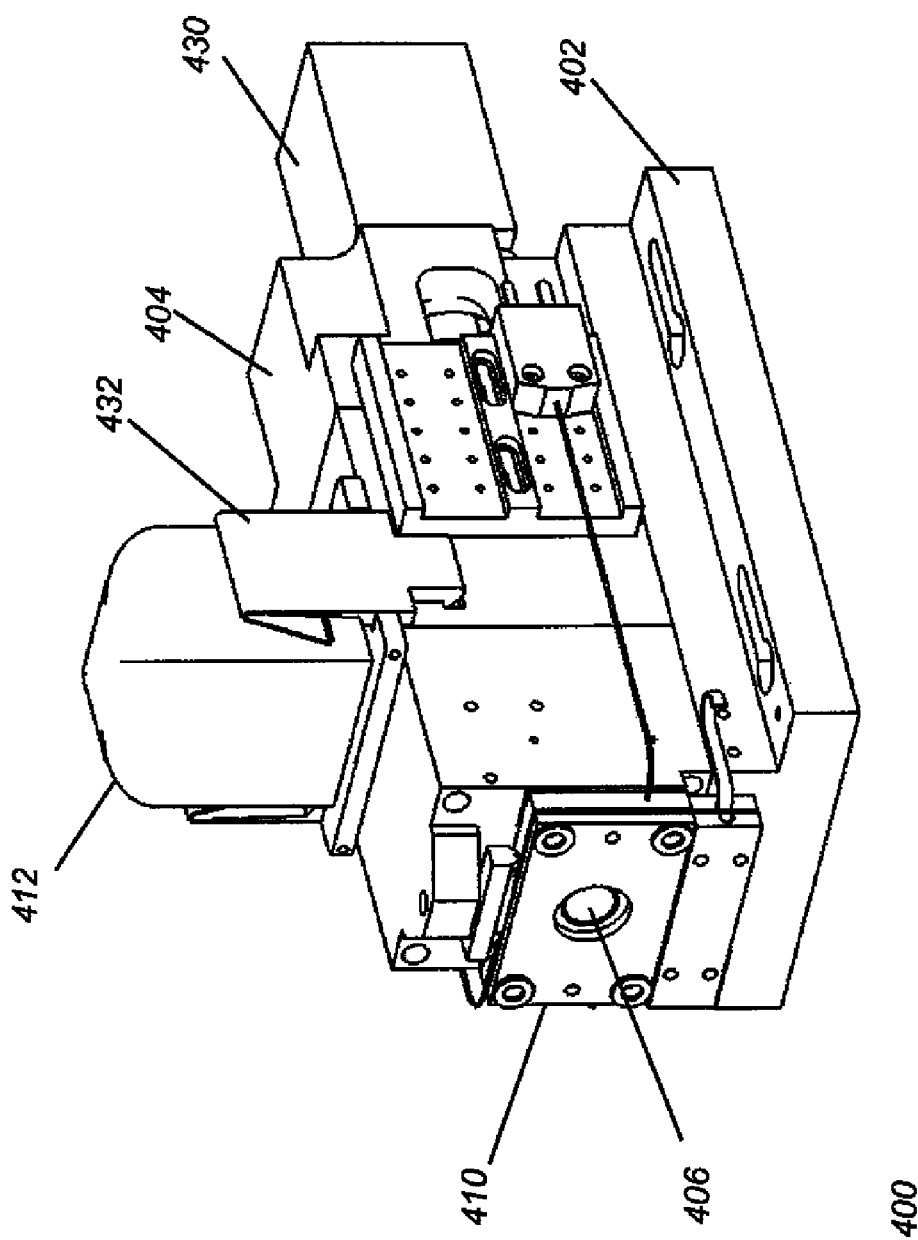

Turning now to FIG. 11, there is shown a cross-sectional view of a pixel of a light-emitting OLED device 310 that can be prepared in part according to the present invention. The OLED device 310 includes at a minimum a substrate 320, a cathode 390, an anode 330 spaced from cathode 390, and a light-emitting layer 350. The OLED device can also include a hole-injecting layer 335, a hole-transporting layer 340, an electron-transporting layer 355, and an electron-injecting layer 360. Hole-injecting layer 335, hole-transporting layer 340, light-emitting layer 350, electron-transporting layer 355, and electron-injecting layer 360 include a series of organic layers 370 disposed between anode 330 and cathode 390. Organic layers 370 are the organic material layers most desirably deposited by the device and method of this invention. These components will be described in more detail.

Substrate 320 can be an organic solid, an inorganic solid, or a combination of organic and inorganic solids. Substrate 320 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 320 can be a homogeneous mixture of materials, a composite of materials, or multiple layers of materials. Substrate 320 can be an OLED substrate, that is a substrate commonly used for preparing OLED devices, e.g. active-matrix low-temperature polysilicon or amorphous-silicon TFT substrate. The substrate 320 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 320 and is most commonly configured as an anode 330. When EL emission is viewed through the substrate 320, anode 330 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 335 be formed over anode 330 in an organic light-emitting display. The hole-injecting material can serve to improve the film formation property of subsequent organic layers and to facilitate injection of holes into the hole-transporting layer. Suitable materials for use in hole-injecting layer 335 include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer 340 be formed and disposed over anode 330. Desired hole-transporting materials can be deposited by any suitable means such as evaporation, sputtering, chemical vapor deposition, electrochemical means, thermal transfer, or laser thermal transfer from a donor material, and can be deposited by the device and method described herein. Hole-transporting materials useful in hole-transporting layer 340 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A.

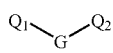

A wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B.

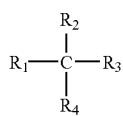

B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C.

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D.

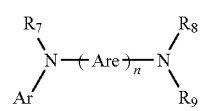

D wherein:
each Are is an independently selected arylene group, such as a phenylene or anthracene moiety;
n is an integer of from 1 to 4; and
Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. The device and method described herein can be used to deposit single- or multi-component layers, and can be used to sequentially deposit multiple layers.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layer 350 produces light in response to hole-electron recombination. Light-emitting layer 350 is commonly disposed over hole-transporting layer 340. Desired organic light-emitting materials can be deposited by any suitable means such as evaporation, sputtering, chemical vapor deposition, electrochemical means, or radiation thermal transfer from a donor material, and can be deposited by the device and method described herein. Useful organic light-emitting materials are well known. As more fully described in U.S. Pat. Nos. 4,769,292 and 5,935,721, the light-emitting layers of the organic EL element include a luminescent or fluorescent material where electroluminescence is produced as a result of electron-hole pair recombination in this region. The light-emitting layers can include a single material, but more commonly include a host material doped with a guest compound or dopant where light emission comes primarily from the dopant. The dopant is selected to produce color light having a particular spectrum. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. The device and method described herein can be used to coat multi-component guest/host layers without the need for multiple vaporization sources.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

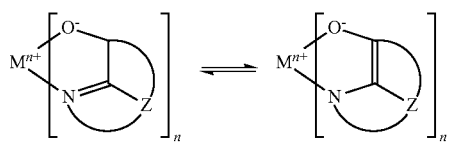

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

The host material in light-emitting layer 350 can be an anthracene derivative having hydrocarbon or substituted hydrocarbon substituents at the 9 and 10 positions. For example, derivatives of 9,10-di-(2-naphthyl)anthracene constitute one class of useful host materials capable of supporting electroluminescence, and are particularly suitable for light emission of wavelengths longer than 400 nm, e.g., blue, green, yellow, orange or red.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2, 2', 2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distryrylbenzene or distyrylbiphenyl, bis(azinyl)methane boron complex compounds, and carbostyryl compounds.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein.

While not always necessary, it is often useful that OLED device 310 includes an electron-transporting layer 355 disposed over light-emitting layer 350. Desired electron-transporting materials can be deposited by any suitable means such as evaporation, sputtering, chemical vapor deposition, electrochemical means, thermal transfer, or laser thermal transfer from a donor material, and can be deposited by the device and method described herein. Preferred electron-transporting materials for use in electron-transporting layer 355 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

An electron-injecting layer 360 can also be present between the cathode and the electron-transporting layer. Examples of electron-injecting materials include alkaline or alkaline earth metals, alkali halide salts, such as LiF mentioned above, or alkaline or alkaline earth metal doped organic layers.

Cathode 390 is formed over the electron-transporting layer 355 or over light-emitting layer 350 if an electron-transporting layer is not used. When light emission is through the anode 330, the cathode material can include nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through cathode 390, it must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Modular Components for Materials Delivery

It can be appreciated that the apparatus and methods of the present invention are advantaged over conventional methods that are unable to provide any type of continuous supply of material for deposition, but must rely on expending a fixed amount of material in each production run. It would be further advantageous to provide a materials supply mechanism that can be easily replenished, that requires minimal handling by fabrication personnel and eliminates guesswork and that supports continuous operation of vaporization apparatus 10.

Referring to FIGS. 12 through 20, there are shown key components of a materials delivery apparatus 400 for supporting continuous deposition, according to one embodiment. A cartridge receiver 402, shown more clearly in FIG. 20, can be configured to act as a receptacle and provide a base for accepting a supply and feed cartridge 404, shown more clearly in FIG. 18 and in the cutaway views of FIGS. 16 and 19. Supply and feed cartridge 404 fits into place within cartridge receiver 402, typically with a sealed connection at the mechanical interface. Cartridge receiver 402 contains a heater 410 or vaporization element for vaporization of the particulate material provided from supply and feed cartridge 404. Vapor is emitted into deposition chamber 280 (FIG. 10) from a vapor output port 406. In different embodiments, cartridge receiver 402 and heater 410 components may either be removable, so that they are provided along with supply and feed cartridge 404, or may remain integrally attached to deposition chamber 280.

Figure 15:
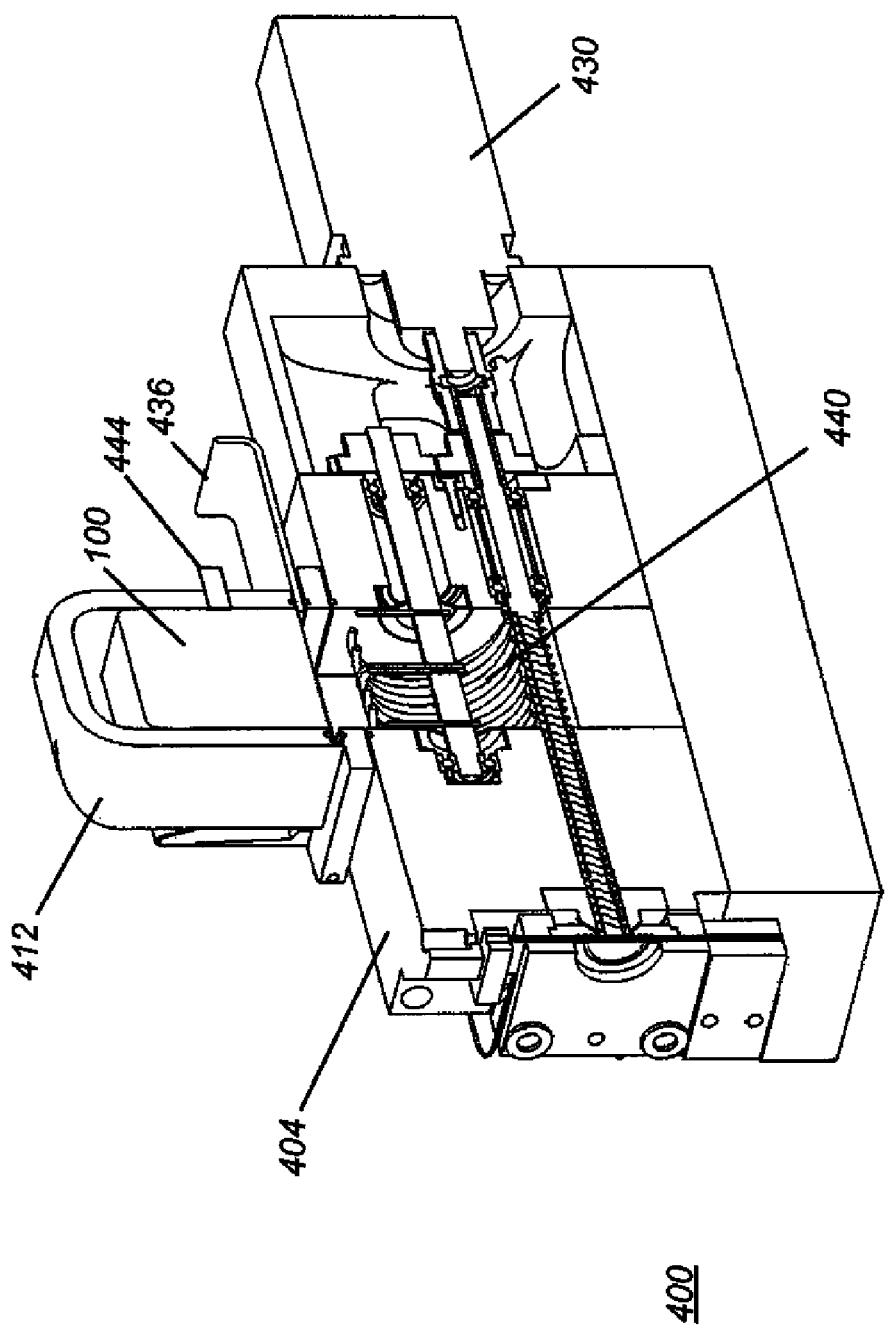
Figure 16:
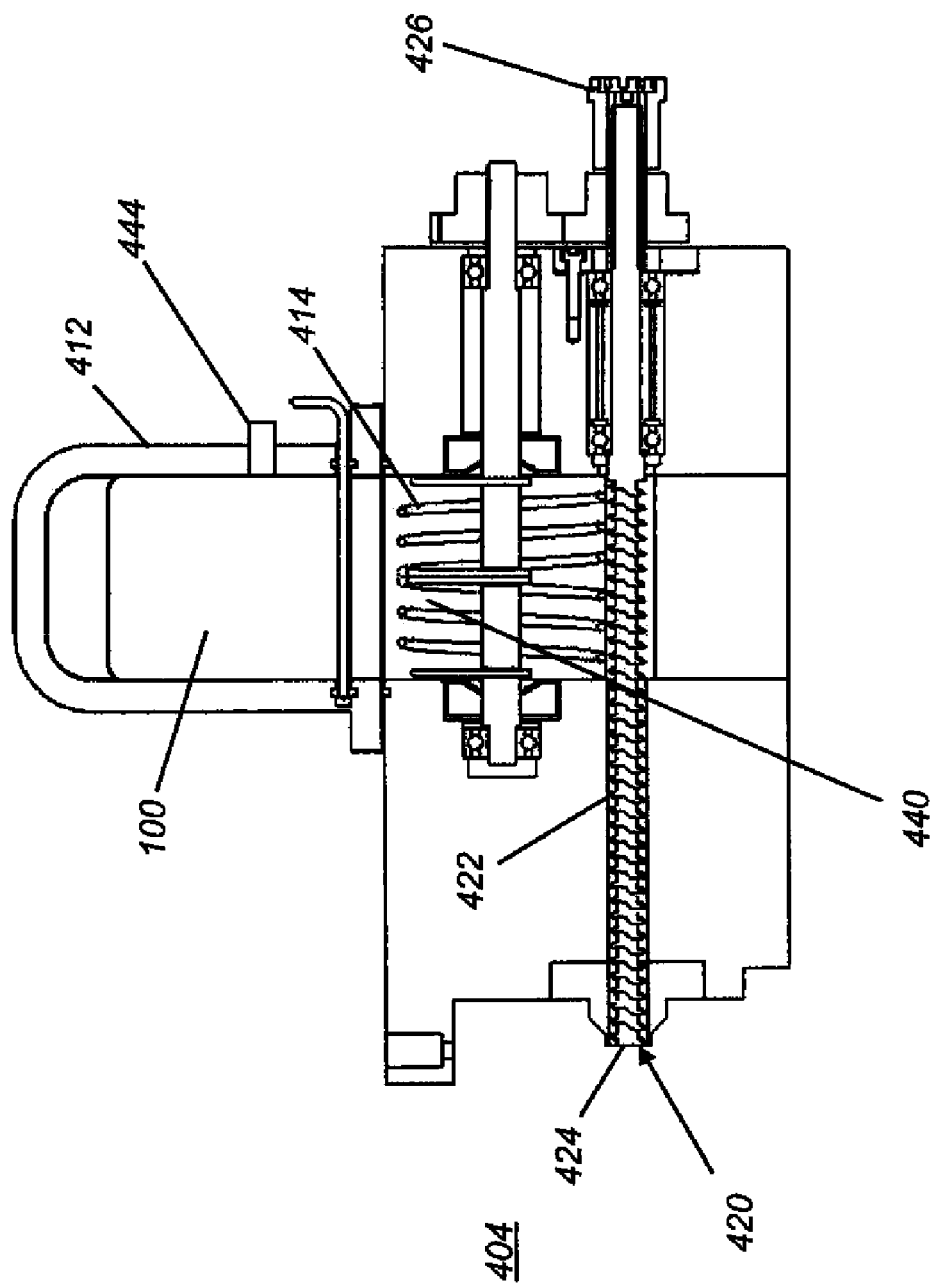
Figure 19:
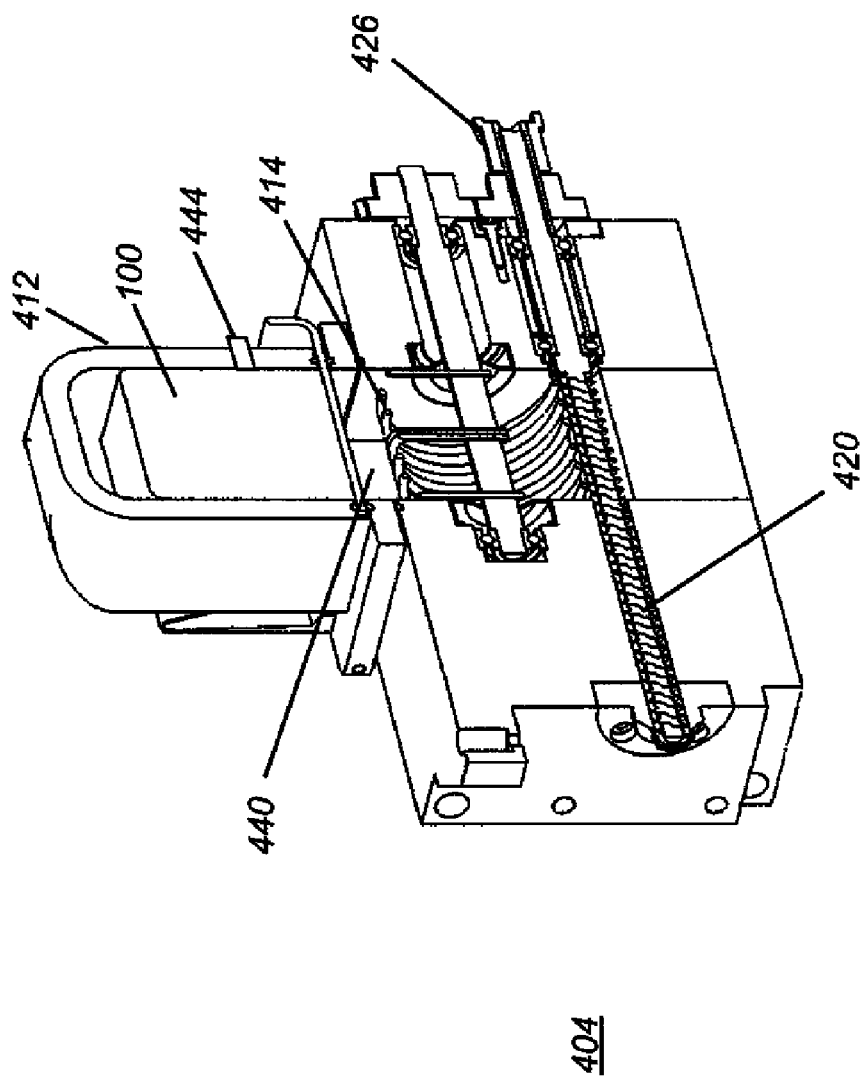
Figure 20:
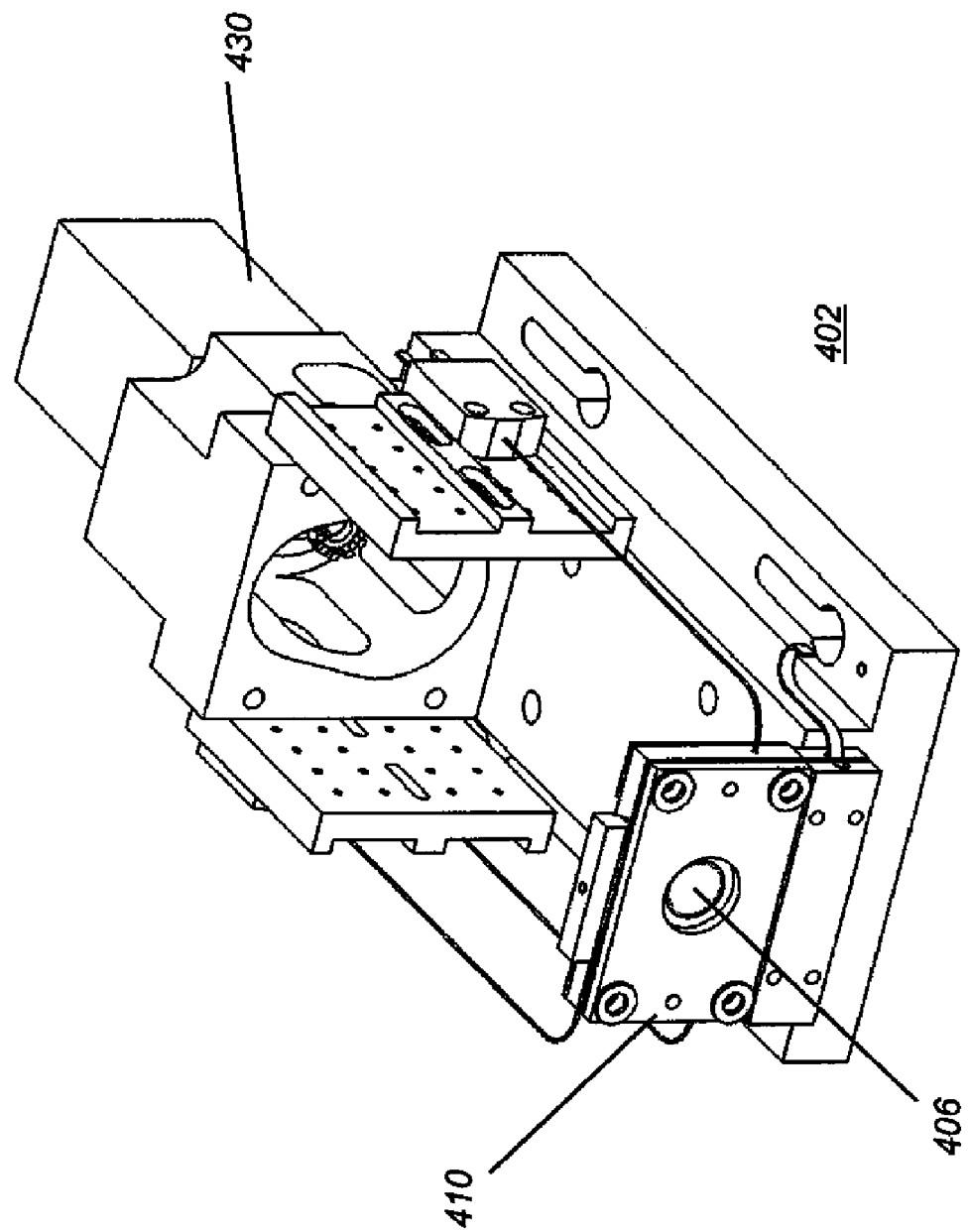
Figure 21:
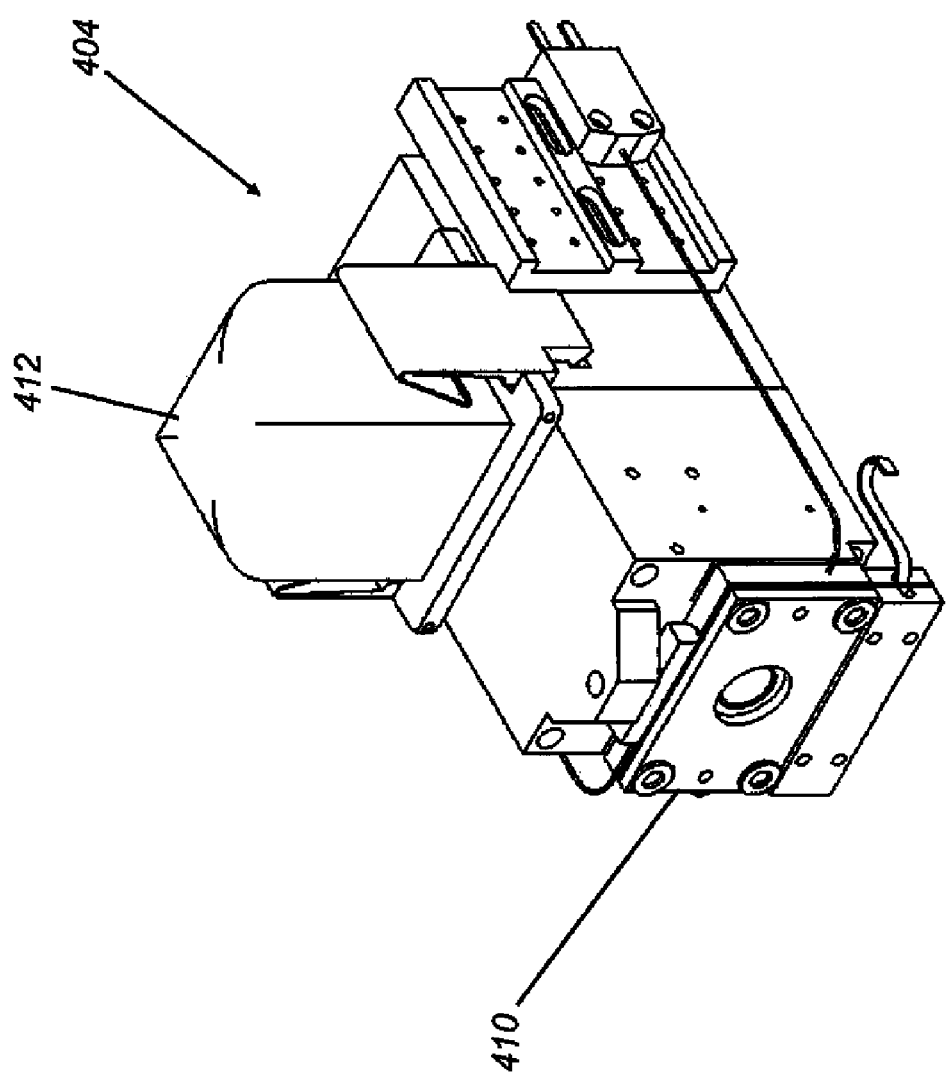
Figure 22:
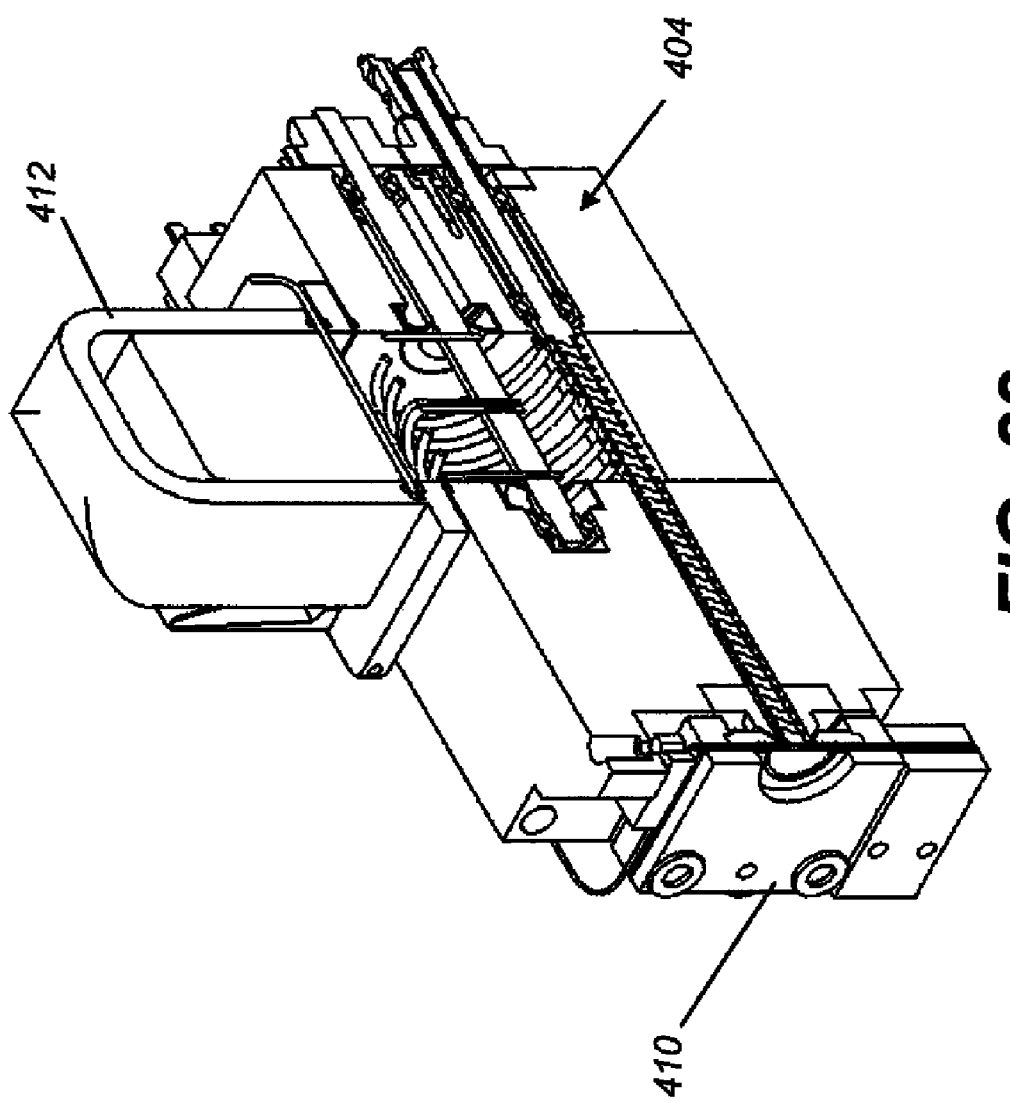
Figure 23:
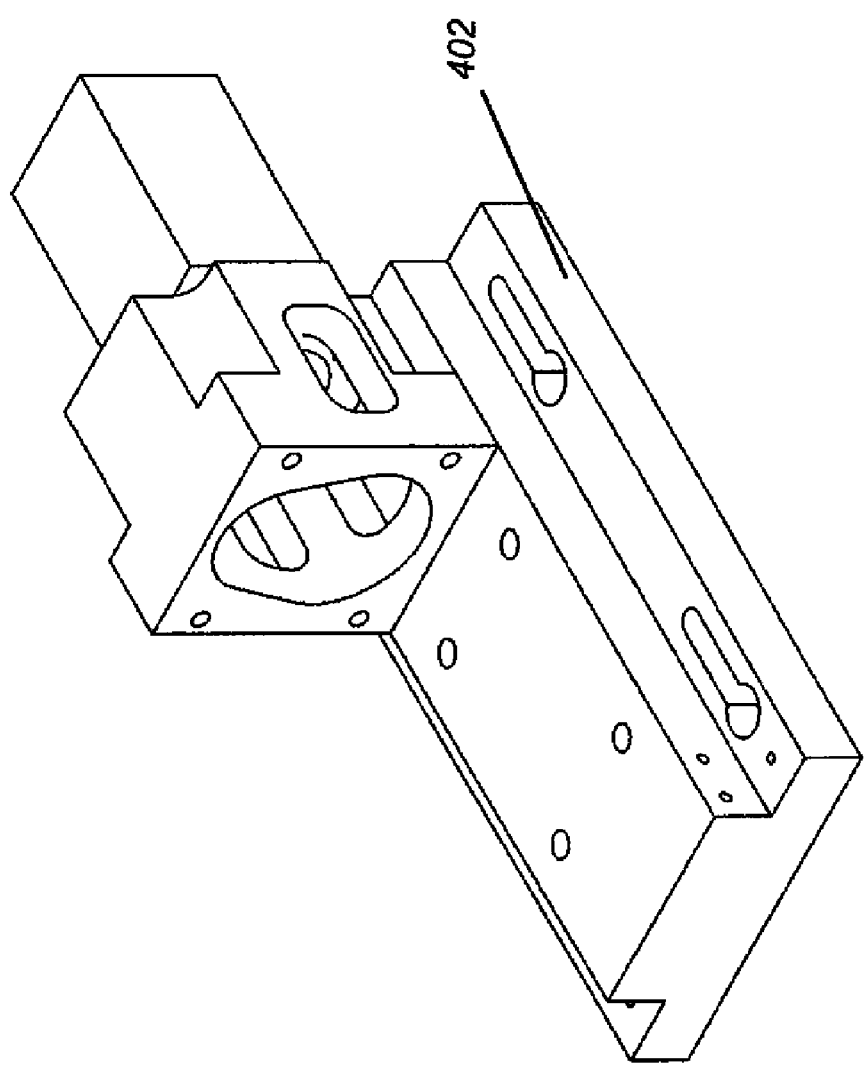
Figure 24:
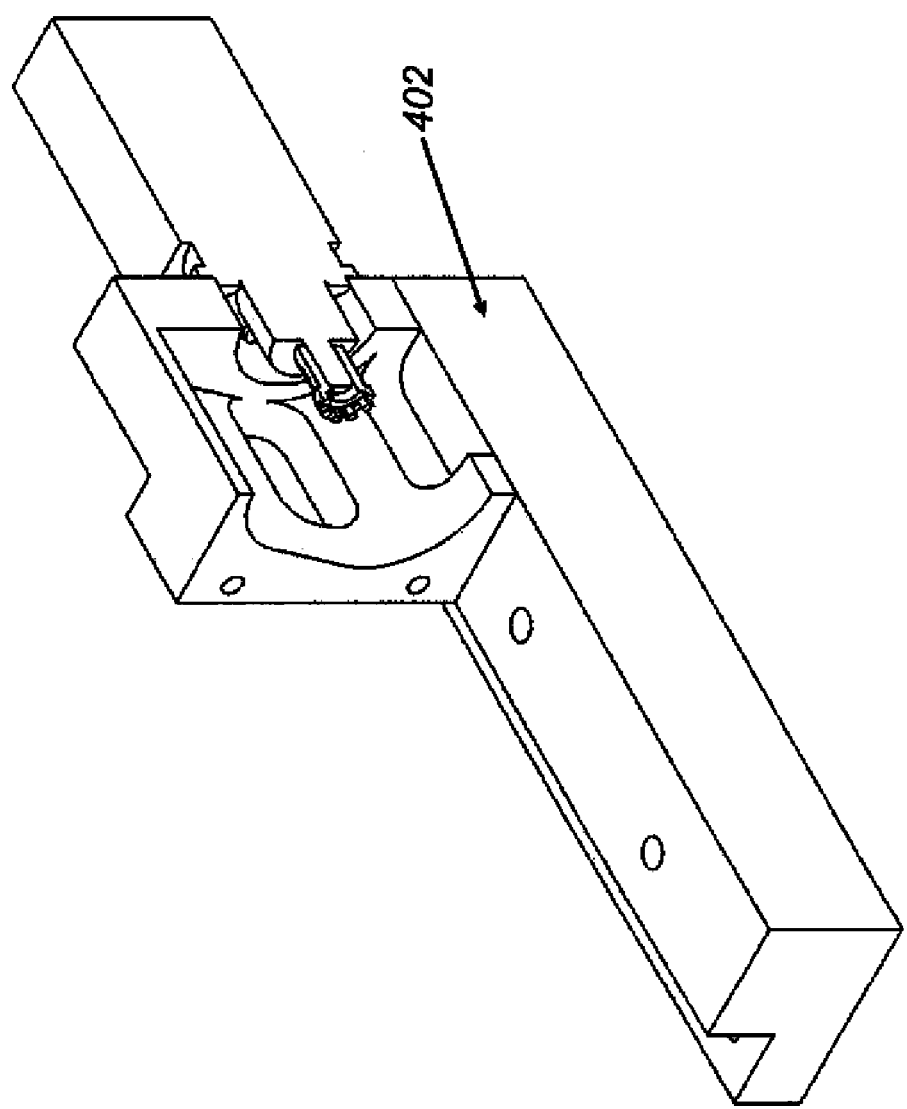

Detailed views of the internal configuration of supply and feed cartridge 404 in this embodiment are given in FIGS. 16 and 19. A powder cartridge 412 provides a supply of organic particulate material 100 to agitation and feeding components. An agitator of some type, such as agitating auger 414, facilitates the feeding of particulate material into an agitation chamber 440 and to a feeding path 420. Alternate types of agitators can include piezo-electric actuators, for example. Where openings are appropriately dimensioned, an agitator device may be unnecessary. A feeding auger 422 moves the particulate material along feeding path 420, metering the material towards a material output port 424. A coupling mechanism 426, driven by a motor 430 (FIGS. 12, 15, and 20), provides rotation of the shaft of feeding auger 422 and, optionally, also actuation of agitating auger 414. Motor 430 may be a part of cartridge receiver 402, as shown in FIG. 20, or may be part of supply and feed cartridge 404, or be externally provided.

Within supply and feed cartridge 404, the temperature of the material can be maintained well below vaporization temperature. Where heater 410 is a flash heater, for example, it would be possible to control the temperature of particulate material being transferred by auger 422 to well below the vaporization temperature provided at flash heater 410. This would enable the mixture, in the same feed path, of two materials having vaporization temperatures that differ by more than a few degrees.

Figure 13:
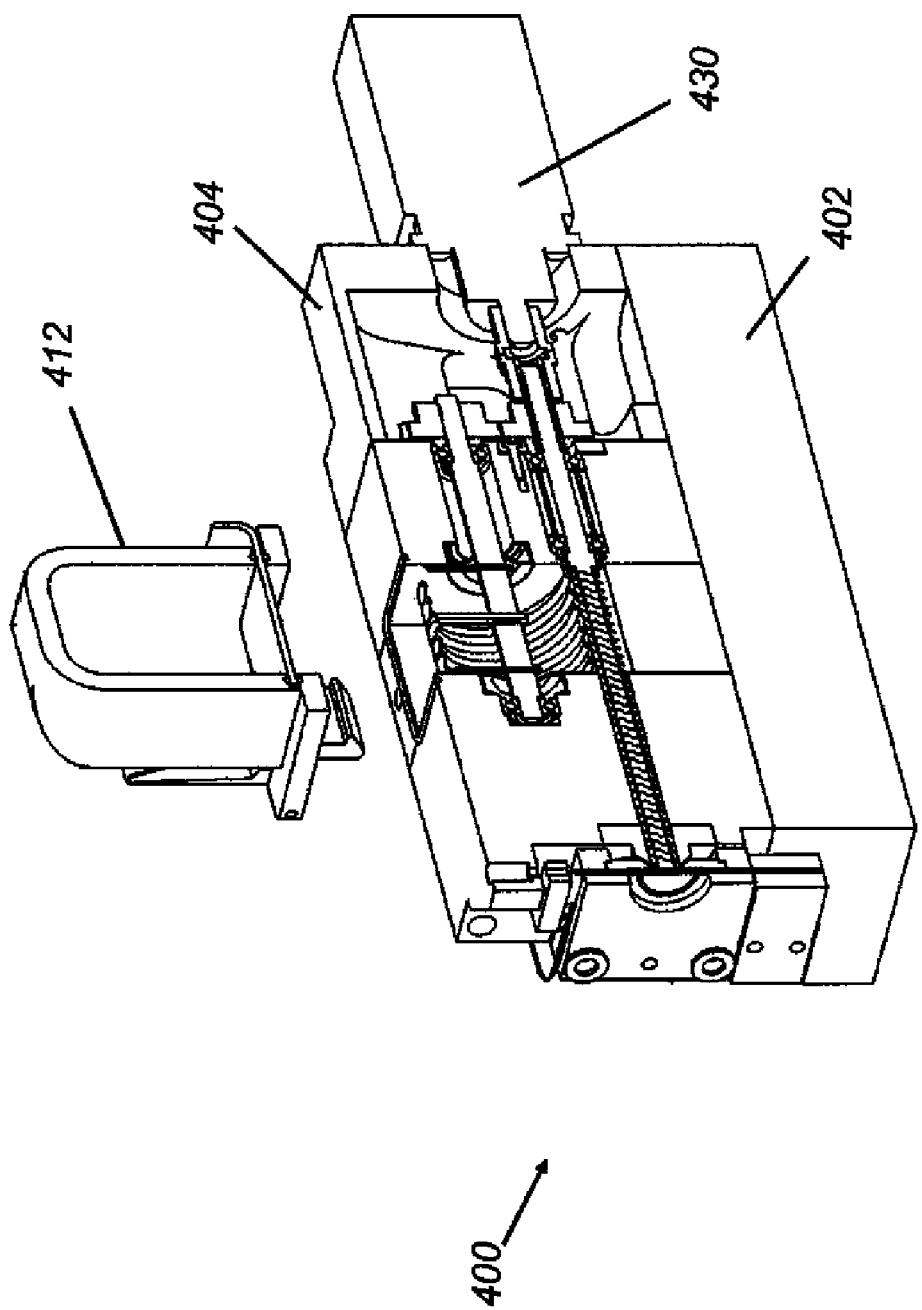
Figure 14:
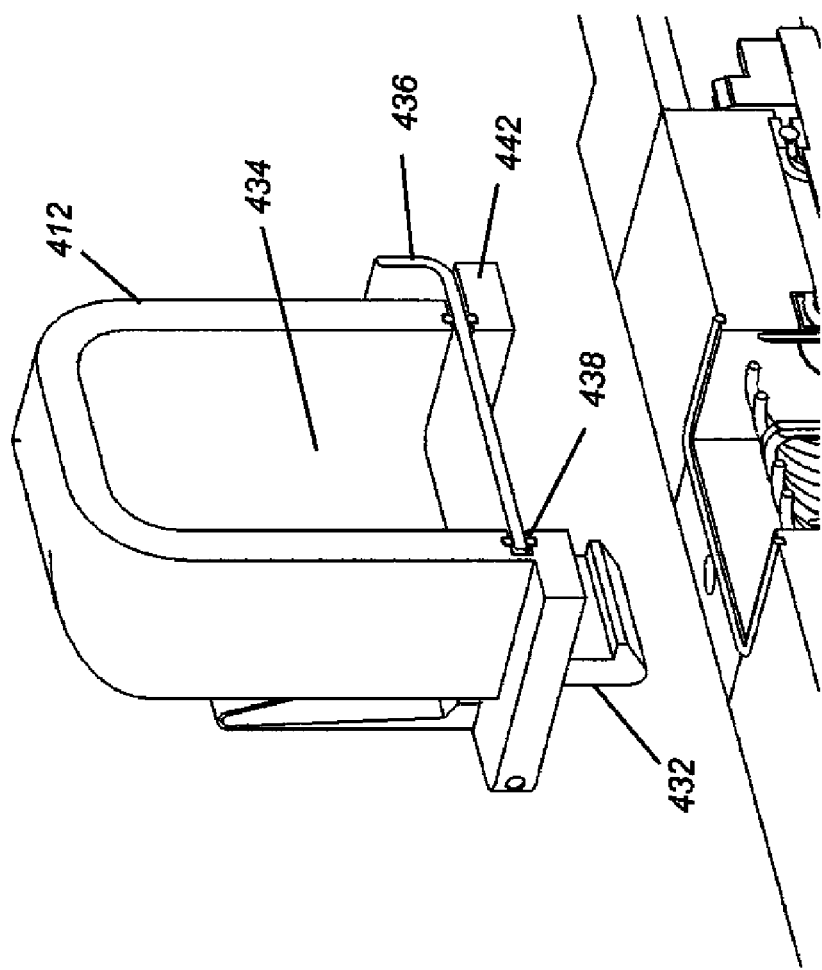

Using the arrangement of FIGS. 12, and 15-20, it would be possible to provide supply and feed cartridge 404 as a replaceable modular unit to support operation of vaporization apparatus 10. Further modularity is possible by appropriate design of powder cartridge 412. As is shown in FIGS. 13 and 14, powder cartridge 412 can itself be a removable and replaceable component, snapped or otherwise fitted into place on supply and feed cartridge 404. A fastener 432, such as the familiar locking tab fastener 432 shown with particular clarity in FIGS. 12, 14, and 18, could be used to secure powder cartridge 412 in place against the main body of supply and feed cartridge 404.

The close-up sectional view of FIG. 14 shows an arrangement of powder cartridge 412. A cavity 434 holds a supply of particulate material. A slide valve 436 or other type of valve mechanism helps to seal and protect the particulate material until powder cartridge 412 is suitably positioned in supply and feed cartridge 404.

One key advantage of powder cartridge 412 relates to preventing material contamination. Slide valve 436 and an arrangement of seals 438 and 442 help to maintain the particulate material under suitable conditions of pressure and ambient exposure before and after powder cartridge 412 is seated in place. Cavity 434 can be filled in a clean room, using an inert gas (for example, argon, nitrogen, helium, etc.), filled dry box, or similar environment in order to maintain a high level of purity of the particulate material. Bake-out cycles or other techniques could be employed, for example, to drive out moisture or other impurities. Following this, cavity 434 could be sealed to protect the material during subsequent shipping and handling. The material could be sealed in a vacuum or pressurized environment. Cavity 434 could be treated to further protect the sealed material during storage, for example.

Alternately, powder cartridge 412 could be affixed against the main body of supply and feed cartridge 404 as shown in FIGS. 15 and 16 with cavity 434 as well as the agitation chamber 440 and feeding path 420 being filled with preconditioned powder. The material output port 424 would be provided with a sealing element to prevent environmental contamination of the conditioned powder. The sealing element could take the form of a commonly used removable cap or peelable seal or alternately, could consist of a vaporizable sealing element such as a solidified melt of the same powdered material as in the powder cartridge 424, or a different material. The vaporizable sealing material would not be removed prior to insertion of supply and feed cartridge 404 into cartridge receiver 402 but would instead be advanced by auger 422 toward the heater 410, acting as the vaporization element, and be vaporized during the first few seconds of operation to expose contamination free powder protected behind the vaporizable sealing element. The tortuous path afforded by the powder filled auger 422 provides a very low conductance path for environmental impurities and thereby alleviates some of the stringent sealing requirements otherwise imposed on the sealing element. Most impurities would be trapped in the first few milligrams of powdered material and could be vaporized into a waste recovery station prior to depositing film on the product substrates. Alternately, sealing of the powder from the external environment may be accomplished using a blank o-ring seal or using a fitting such as a Cajon fitting (Cajon Corporation) that seals against the outside surface of feed path 420.

A sensing element 444, could be provided as part of powder cartridge 412 for sensing the amount of material contained therein, as shown in FIG. 15. Sensing element 444 could simply be used to detect that the supply amount is less than some desirable threshold value and that replenishment is needed, for example. Sensing element 444 could be any of a number of types of suitably configured sensors, including a level sensor, photosensor, or pressure sensor, for example.

Figure 17:
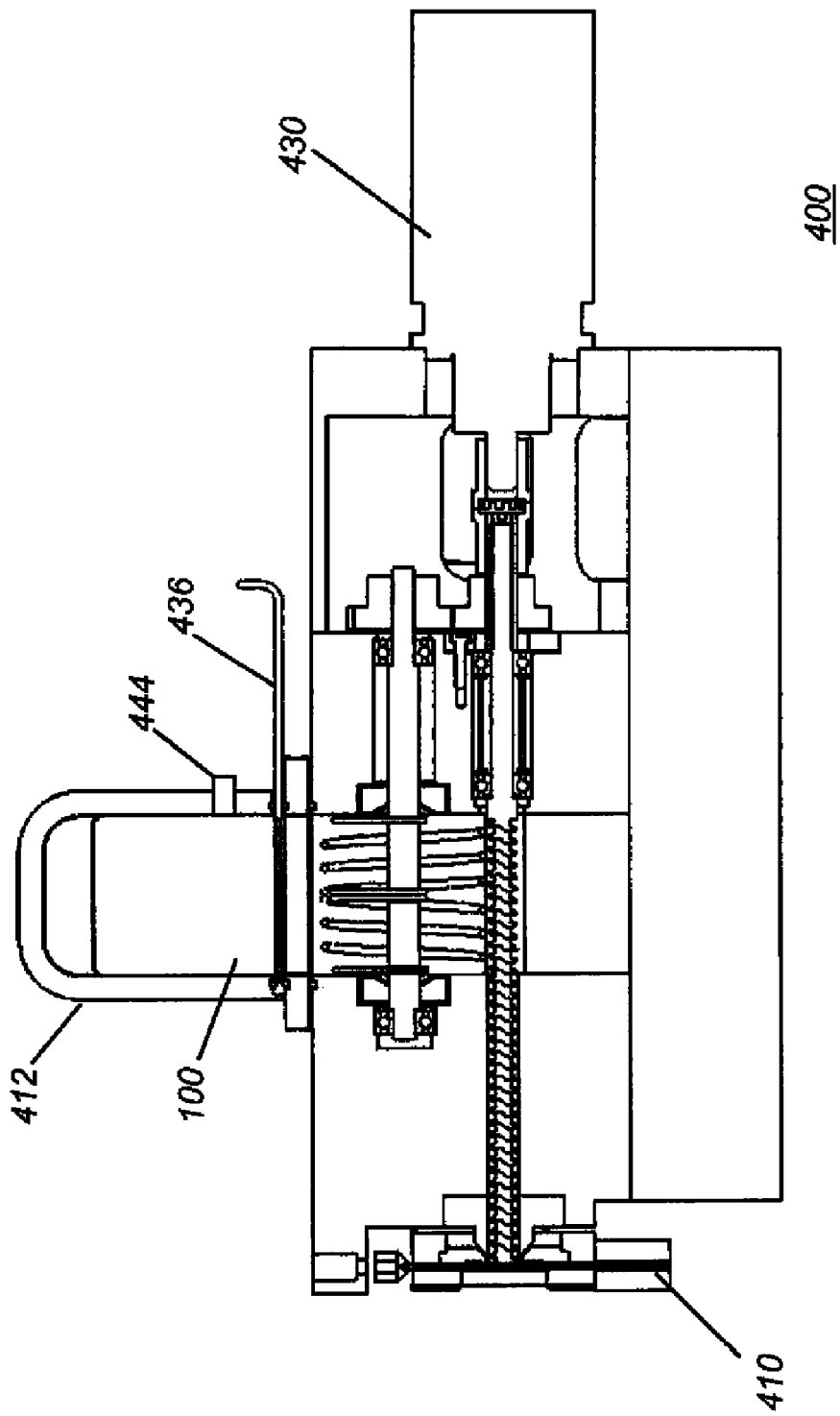
Figure 18:
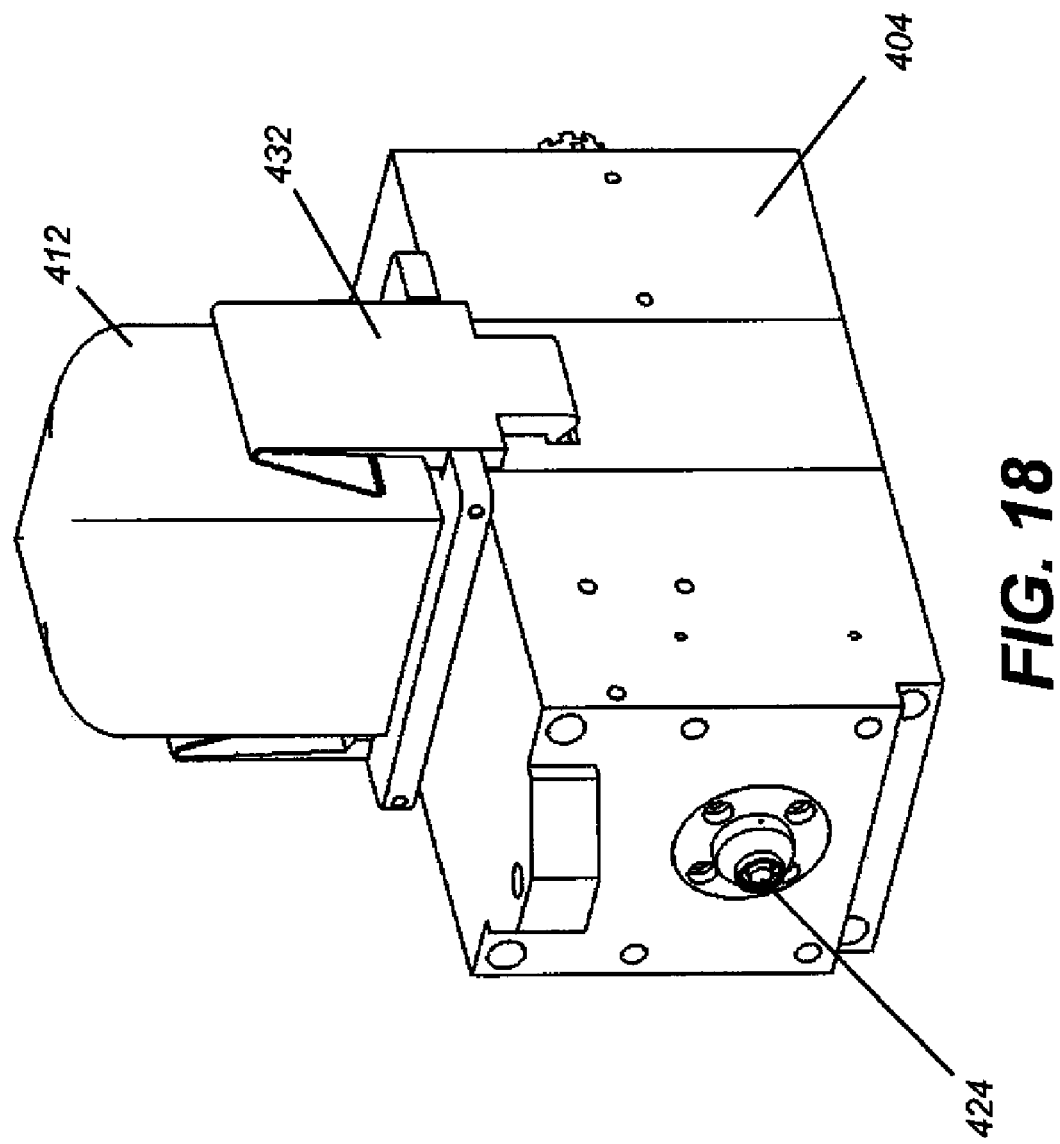

The cutaway views of FIGS. 15 and 17 show slide valve 436 moved into its "open" position to allow feeding of organic particulate material 100 into agitation chamber 440 of supply and feed cartridge 404. It can be appreciated that this type of arrangement can be advantageous where vacuum pressure within the deposition apparatus itself must be maintained. For example, a second slide valve (not shown) positioned on supply and feed cartridge 404 above agitation chamber 440 could provide a vacuum-maintaining seal during removal and replacement of powder cartridge 412. Using this and similar techniques familiar to those in the deposition arts, the present invention would allow an operator to remove and replace powder cartridge 412, for example, without compromising the vacuum seal. By comparison, earlier approaches, even though unable to replenish during the deposition process, required complex sequences of vacuum valve actuation for transporting material into the deposition chamber.

FIG. 21 is a three-dimensional view of supply and feed cartridge 404 in an alternate embodiment, particularly well suited for replacement of supply and feed cartridge 404 as a modular component. Here, heater 410 is a component of supply and feed cartridge 404 rather than being part of cartridge receiver 402. FIG. 22 is a cutaway isometric view of supply and feed cartridge 404, showing similar internal structure to those of FIGS. 13, 15, 16, and 17. FIG. 23 is a three-dimensional view and FIG. 24 an isometric cross-section view of cartridge receiver 402 in this alternate embodiment. Some type of sealing mechanism, not shown in FIG. 21, using design strategies and techniques well known in the mechanical arts, would normally be required to ensure a close fitting and adequate seal at mechanical interfaces, such as between supply and feed cartridge 404 and cartridge receiver 402 (FIG. 12) and at the mechanical interface for heater 410 and for material output port 424 (FIG. 16). The sealing mechanism permits the feed cartridge 404 to be useable or another feed cartridge to be used.

Thus, it can be seen that modularity is possible in several ways using the apparatus of the present invention. In one embodiment, materials delivery apparatus 400 may be supplied as a complete modular unit, to be fitted against a deposition chamber. Alternately, cartridge receiver 402 could be a non-removable part of materials delivery apparatus 400, so that supply and feed cartridge 404 is replaced as needed. As yet another option, supply and feed cartridge 404 may be left in place for an extended period of time, so that only powder cartridge 412 is replaced at intervals. As yet another option, powder cartridge 412 may include the powder agitation auger 414 as shown in FIGS. 25 and 26. Using this option, the supply and feed cartridge 404 would again be left in place for an extended period of time and would not include the agitation auger 414, so that again, only powder cartridge 412 is replaced at intervals. Some type of sealing mechanism, shown in FIG. 14, configured using techniques well known in the mechanical arts, would normally be required to ensure a close fitting and maintain an adequate seal at the mechanical interface between powder cartridge 412 and supply and feed cartridge 404.

The invention has been described in detail with particular reference to certain preferred embodiments thereof, namely for delivery of organic particulate materials to a vaporization zone. However, it can be appreciated that the present invention applies more broadly to particulate materials, including organic and other types of particulate materials. The term "particulate materials" can include a broad range of substances in particulate form, including, but not limited to, crystals, nanotubes, powders, needles, flakes, and other solid materials that can be classified as discontinuous, for example. Moreover, the particulate materials may be provided in a mixture containing a quantity of inert material or materials acting as a carrier for the component material. Inert carriers could include other types of solid materials as well as pastes and liquids, particularly liquid materials having higher viscosities. Any inert material selected must be compatible with the vaporization process, such that the inert carrier is appropriately discarded before or during the vaporization of the component particulate material. For example, the inert carrier can be selected from materials having a much higher vaporization temperature than the desired particulate component material. As just one example, organic particulate material 100 (FIG. 3) could be a mixture containing sand and the particulate component material that is to be vaporized. The utilization of such an inert carrier, with suitable mixing techniques, would allow the metering of minute quantities of a component particulate material, such as an organic particulate material, for vaporization.

The various configurations shown in FIGS. 12-26 are exemplary only, showing only some of the possible ways in which a replaceable module for replenishment of particulate material could be provided. As has been shown, replaceable components could include the complete material supply and feeding assembly or portions thereof, including a refill cartridge or container, such as powder cartridge 412, for example. This type of arrangement allows deposition processing to continue for longer periods, since replenishment can be performed without pausing or stopping the deposition process. Various arrangement of sealing elements, gaskets, or special fittings could be employed to provide a protective seal that effectively isolates the particulate material from airborne dust, moisture, or other contaminants in the environment.

It can thus be understood that a number of variations and modifications can be effected within the spirit and scope of the invention.

Parts List

5 vaporization device
6 source
7 source
8 source
9 vapor plume
10 vaporization apparatus
15 substrate
20 manifold
30 aperture
40 feeding apparatus
50 first container
60 feeding path
70 second container
80 auger structure
85 auger screw
85*a* auger screw
85*b* auger screw
85*c* auger screw
90 motor 95 auger structure
100 organic particulate material
105 auger structure
110 screen
115 helical thread
120 screen
125 center portion
130 piezoelectric structure
135 thread-free portion
140 piezoelectric structure
150 piezoelectric structure Parts List Cont'd 155 piezoelectric structure
160 organic particulate material
170 heating element
180 base
190 bottom portion
210 rotating thread type device
220 gear driver
230 opening
240 motor
250 third container
260 first feeding path
265 second feeding path
270 vacuum exposure opening
275 load lock
280 deposition chamber
285 OLED substrate
295 translational apparatus
300 vacuum source
310 OLED device
320 substrate
330 anode
335 hole-injecting layer
340 hole-transporting layer
350 light-emitting layer
355 electron-transporting layer
360 electron-injecting layer
370 organic layers
390 cathode
400 Materials delivery apparatus Parts List Cont'd 402 Cartridge receiver
404 Supply and feed cartridge
406 Vapor output port
410 Heater
412 Powder cartridge
414 Agitating auger
420 Feeding path
422 Feeding auger
424 Material output port
426 coupling mechanism
430 Motor
432 Fastener
434 Cavity
436 Slide valve
438 Seal
440 Agitation chamber
442 Seal
444 Sensing element

The invention claimed is:

1. A cartridge made ready for insertion in or removal from a deposition apparatus and for delivering particulate material into a deposition chamber having a vaporization zone to vaporize such material to form a layer, wherein said cartridge defines:
 (a) a cartridge receiver;
 (b) a sealed powder sub-assembly defining a cavity for receiving material under a controlled environment for preventing material contamination;
 (c) means for delivering material from the cavity into an agitation chamber and means for continuously metering such agitated material along a sealable feed path to the vaporization zone;
 (d) such that the sealed powder sub-assembly and the sealable feed path together form a supply and feed sub-assembly; and
 (e)
  (i) means for removably securing the cartridge to the deposition chamber, and
  (ii) means for removably securing the supply and feed sub-assembly to the cartridge receiver, and
  (iii) means for removably securing the sealed powder sub-assembly to the supply and feed sub-assembly.

2. The cartridge of claim 1 further including means for fluidizing material in the agitation chamber.

3. The cartridge of claim 2 wherein the means for fluidizing the material includes energizing a piezoelectric actuator or an agitating auger.

4. The cartridge of claim 1 wherein the cartridge includes a heating element for providing energy for vaporization.

5. The cartridge of claim 1 wherein the cavity is under vacuum.

6. The cartridge of claim 1 wherein the cavity is under pressure.

7. The cartridge of claim 1 wherein the particulate material in the feeding path includes at least a first material and a second material.

8. The cartridge of claim 1 further including means for sensing the quantity of particulate material in the sealed powder sub-assembly.

9. The cartridge of claim 1 wherein the controlled environment is a condition that the material received in the cavity is sealed in a vacuum or pressurized environment.

10. An apparatus for using heat at a vaporization zone in a deposition chamber for vaporizing particulate material to form a layer, comprising:
 a cartridge made ready for insertion in or removal from the deposition apparatus including:
 a cartridge receiver,
 a sealed powder sub-assembly defining a cavity for receiving material under a controlled environment for preventing material contamination,
 means for receiving material from the cavity into an agitation chamber and means for continuously metering such agitated material along a sealable feed path to the vaporization zone,
 such that the sealed powder sub-assembly and the sealable feed path together form a supply and feed sub-assembly, and
  (i) means for removably securing the cartridge to the deposition chamber, and
  (ii) means for removably securing the supply and feed sub-assembly to the cartridge receiver, and
  (iii) means for removably securing the sealed powder sub-assembly to the supply and feed sub-assembly.

11. The cartridge of claim 10 further includes means for fluidizing material in the agitation chamber.

12. The apparatus of claim 11 wherein the means for fluidizing the material includes energizing a piezoelectric actuator or an agitating auger.

13. The cartridge of claim 10 wherein the cartridge or the deposition chamber includes a heating element for providing energy for vaporization.

14. The apparatus of claim 10 wherein the cavity is under vacuum.

15. The apparatus of claim 10 wherein the cavity is under pressure.

16. The apparatus of claim 10 wherein the particulate material in the feeding path includes at least a first material and a second material.

17. The cartridge of claim 10 further includes means for sensing the quantity of particulate material in the sealed powder sub-assembly.

18. The cartridge of claim 10 wherein the controlled environment is a condition that the material received in the cavity can be sealed in a vacuum or pressurized environment.

* * * * *